US012488718B2

(12) United States Patent
Wang et al.

(10) Patent No.: US 12,488,718 B2
(45) Date of Patent: Dec. 2, 2025

(54) DISPLAY PANEL

(71) Applicant: Shenzhen China Star Optoelectronics Semiconductor Display Technology Co., Ltd., Guangdong (CN)

(72) Inventors: Ruifang Wang, Guangdong (CN); Hua Li, Guangdong (CN); Guangyao Li, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/592,061

(22) Filed: Feb. 29, 2024

(65) Prior Publication Data

US 2025/0209949 A1 Jun. 26, 2025

(30) Foreign Application Priority Data

Dec. 22, 2023 (CN) ......................... 202311792249.6

(51) Int. Cl.
*G09G 3/20* (2006.01)
*H10D 86/40* (2025.01)
*H10D 86/60* (2025.01)

(52) U.S. Cl.
CPC ............. *G09G 3/20* (2013.01); *H10D 86/441* (2025.01); *H10D 86/60* (2025.01); *G09G 2300/0408* (2013.01); *G09G 2300/0819* (2013.01); *G09G 2300/0852* (2013.01); *G09G 2310/08* (2013.01)

(58) Field of Classification Search
CPC ............. G09G 3/20; G09G 2300/0408; G09G 2300/0819; G09G 2300/0852; G09G 2310/08; G09G 3/3233; G09G 3/3266; H01L 27/124; H10D 86/441; H10D 86/60
See application file for complete search history.

(56) References Cited

U.S. PATENT DOCUMENTS

2015/0348472 A1 12/2015 Chan et al.
2020/0027516 A1* 1/2020 Feng .................... G09G 3/3291
2021/0366352 A1* 11/2021 Zou ...................... G09G 3/2092
2023/0317015 A1* 10/2023 Chen .................... H10D 86/481
345/204

FOREIGN PATENT DOCUMENTS

KR 20190125008 A 11/2019

OTHER PUBLICATIONS

German Office Action issued in corresponding German Patent Application No. 102024203483.5 dated Jul. 26, 2024, pp. 1-7.

* cited by examiner

*Primary Examiner* — Brent D Castiaux
(74) *Attorney, Agent, or Firm* — PV IP PC; Peter S. Stecher; Wei Te Chung

(57) ABSTRACT

A display panel includes a display part including multiple sub-pixel rows, and a drive part including a first drive circuit and a second drive circuit. The first drive circuit includes multiple first drive modules, and the second drive circuit includes multiple second drive modules. Each of the first drive modules is electrically connected to a pixel circuit in each of sub-pixel units of each of k adjacent sub-pixel rows, and each of the second drive modules is electrically connected to the pixel circuit in each of the sub-pixel units of each of j adjacent sub-pixel rows, where each of k and j is a positive integer, k is less than or equal to j, and j is greater than or equal to 2.

12 Claims, 13 Drawing Sheets

DISPLAY PANEL

CROSS-REFERENCE TO RELATED APPLICATION

This application claims the priority to Chinese Patent Application No. 202311792249.6, filed on Dec. 22, 2023, the disclosure of which is incorporated herein by reference in its entirety.

FIELD

The present disclosure relates to display technologies, and more particularly, to a display panel.

BACKGROUND

With development of display technologies, there is a high requirement for a narrow frame of a display panel. Therefore, a gate driver on array (GOA) instead of a gate drive chip may be used in a display panel to narrow a frame thereof.

On the other hand, each row of pixel circuits in the display panel generally needs to receive at least two different scanning signals that are generally output respectively from different drive circuits in the GOA corresponding to each row of pixel circuits. That is, the GOA corresponding to each row of pixel circuits needs to incorporate multiple drive circuits and thus requires a relatively wide frame of the display panel where the GOA is disposed, which is contrary to the design of a narrow frame of the display panel.

SUMMARY

According to one or more embodiments of the present disclosure, a display panel includes: a display part including multiple of sub-pixel rows, each of the sub-pixel rows including multiple sub-pixel units providing with respective pixel circuits; and a drive circuit on a side of the display part. The drive circuit and the display part are arranged in a first direction, the drive circuit includes a first drive circuit and a second drive circuit arranged in the first direction, the second drive circuit is disposed between the first drive circuit and the display part, the first drive circuit includes multiple cascaded first drive modules arranged in a second direction, the second drive circuit includes multiple cascaded second drive modules arranged in the second direction, an output of each of the first drive modules is electrically connected to respective pixel circuits in k adjacent ones of the sub-pixel rows, and an output of each of the second drive modules is electrically connected to respective pixel circuits in j adjacent ones of the sub-pixel rows, k is less than or equal to j, k is greater than or equal to 1, j is greater than or equal to 2, and k and j are both positive integers.

DETAILED DESCRIPTION

Some embodiments of the present disclosure will be described in detail below with reference to the accompanying drawings. The embodiments are described for illustrative purposes only and are not intended to limit the present disclosure.

Referring to FIGS. 1 to 19, according to one or more embodiments of the present disclosure, a display panel 100 may include a display part 200 and a drive part 300 provided on a side of the display part 200, and the display part 200 and the drive part 300 are arranged in a first direction X.

Figure 1:
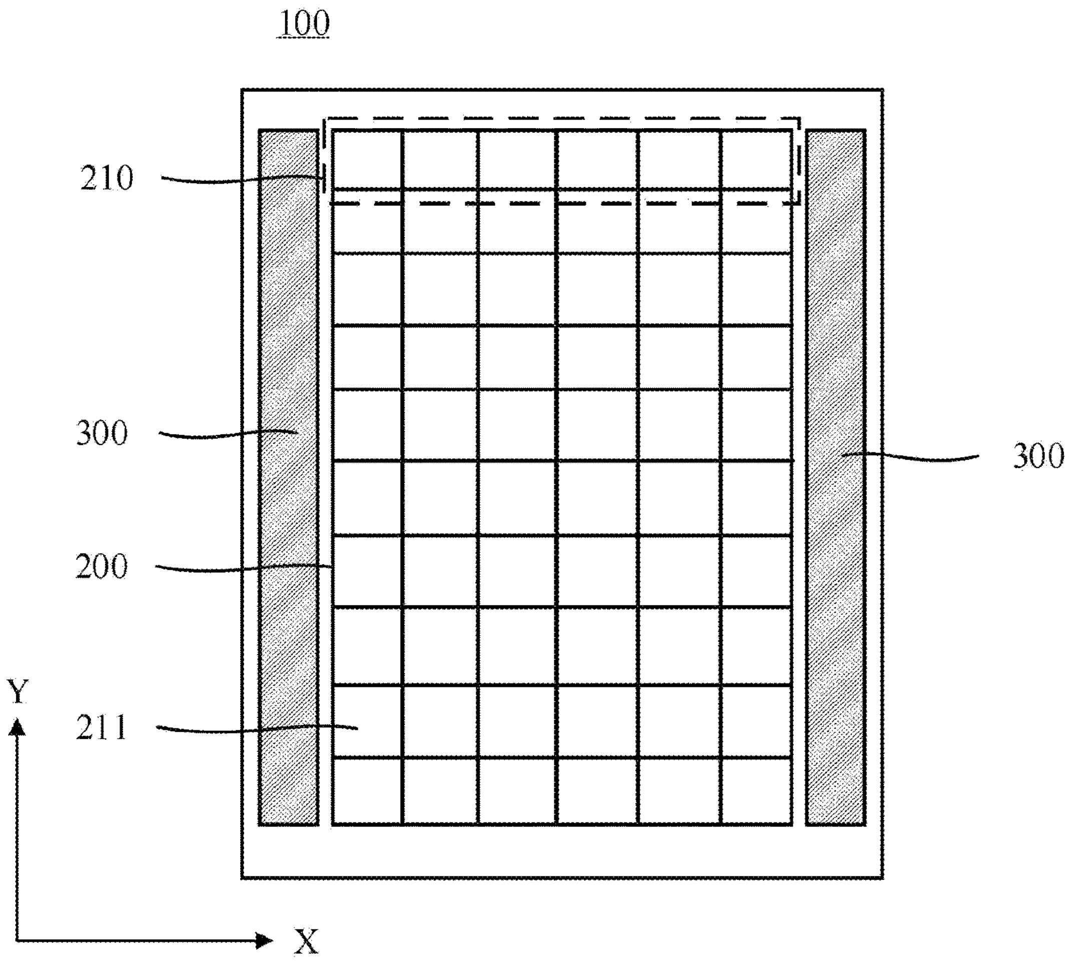
FIG. 1 is a schematic diagram of a structure of a display panel according to one or more embodiments of the present disclosure.

In one or more embodiments, the drive part 300 operates in a manner of single-sided driving or double-sided driving, for example, the structure in FIG. 1 operates in a manner of double-sided driving.

In one or more embodiments, the display part 200 may include multiple sub-pixel rows 210, each sub-pixel row 210 includes multiple sub-pixel units 211, and a pixel circuit 211*a* is provided in each sub-pixel unit 211. The multiple sub-pixel units 211 may be arranged in the first direction X, and the multiple sub-pixel rows 210 may be arranged in a second direction Y.

Figure 3:
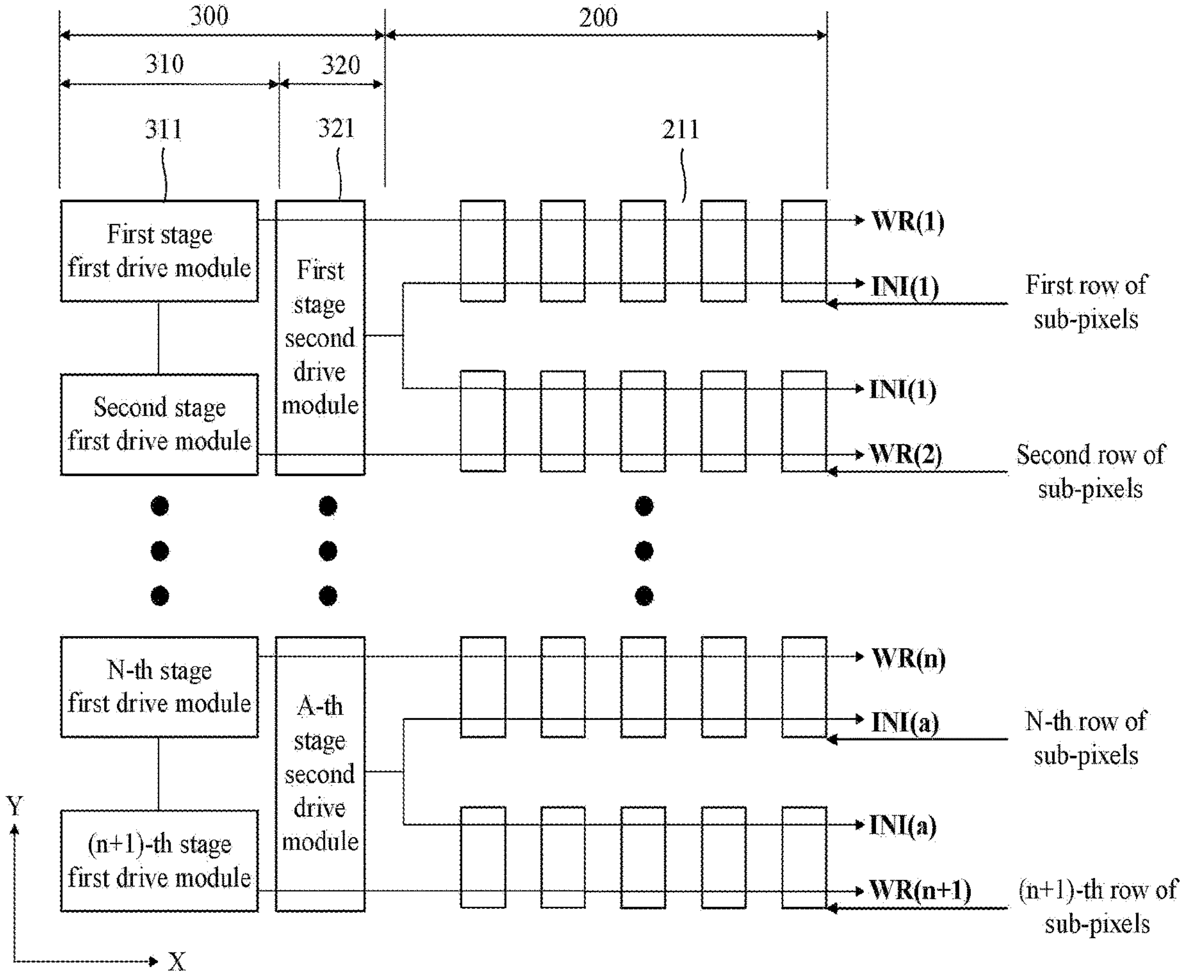
FIG. 3 schematically illustrates a first example of connections between drive circuits in a drive part and sub-pixel rows according to one or more embodiments of the present disclosure.

In one or more embodiments, referring to FIG. 3, the drive part 300 includes a first drive circuit 310 and a second drive circuit 320 arranged in the first direction X. The second drive circuit 320 is disposed between the first drive circuit 310 and the display section 200. The first drive circuit 310 includes multiple first drive modules 311 arranged in the second direction Y, and the second drive circuit 320 includes multiple second drive modules 321 arranged in the second direction Y.

It should be noted that the multiple first drive modules 311 are multiple first GOA units which are cascaded, multiple second drive modules 321 are multiple second GOA units which are cascaded, and the first drive module 311 and the second drive module 321 are different in structure. Based on the difference in structure between the first drive module 311 and the second drive module 321, the first drive module 311 may output at least a first control signal and the second drive module 321 may output at least a second control signal.

In one or more embodiments, an output terminal of a first drive module 311 is electrically connected to respective pixel circuits 211*a* in adjacent k ones of the sub-pixel rows 210, and an output terminal of a second drive module 321 is electrically connected to respective pixel circuits 211*a* in adjacent j ones of the sub-pixel rows 210.

In one or more embodiments, k may take a positive integer greater than or equal to 1, and j may take a positive integer greater than or equal to 2, and k must be less than or equal to j. In one or more embodiments of the present disclosure, for example, k is 1 or 2, and j is 2 or 4.

Note that an included angle between the first direction X and the second direction Y may be greater than 0 and less than or equal to 90 degrees, for example, the first direction X is a horizontal direction, that is, a transverse direction, the second direction Y is a vertical direction, that is, a longitudinal direction, and the included angle between the first direction X and the second direction Y may be equal to 90 degrees.

In one or more embodiments of the present disclosure, a control signal is simultaneously output to respective pixel circuits 211*a* in at least two sub-pixel rows 210 by the output terminal of one of the second drive modules 321 in the drive unit 300. For example, a control signal is output to a pixel circuit 211*a* in one sub-pixel row 210 by one second drive module 321 in a related display panel 100, while the control signal is simultaneously output to respective pixel circuits 211*a* in two sub-pixel rows 210 by one second drive module 321 according to one or more embodiments of the present disclosure. That is, the number of the second drive modules 321 is reduced by half, so that a large amount of space reserved for the second drive circuit 320 in the second direction Y is left for arranging other driving devices. For example, the devices arranged in a transverse direction in the second drive module 321 may be arranged in a longitudinal direction, or the driving devices in other drive circuits may be arranged in the area, thereby reducing space on the frame occupied by the drive part 300, and realizing a narrow frame of a display panel 100.

It should be noted that the pixel circuit 211*a* of one or more embodiments of the present disclosure may be of a type such as 3T1C, 4T1C, 5T2C, 6T1C, and 7T1C, and the technical solution of one or more embodiments of the present disclosure is described below by using simple 3T1C and 4T1C as examples.

Figure 2:
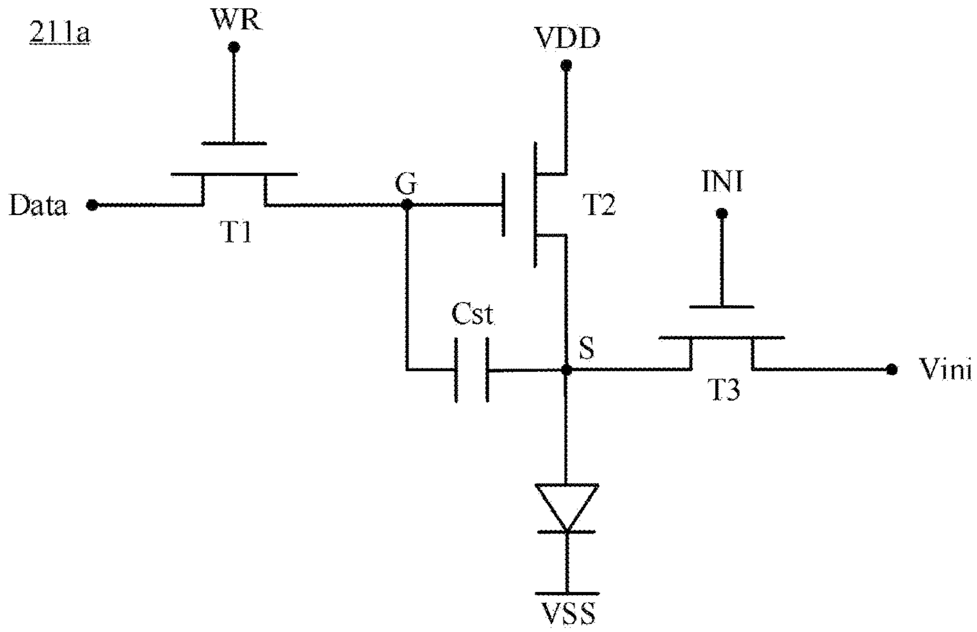
FIG. 2 schematically illustrates a first structure of a pixel circuit according to one or more embodiments of the present disclosure.

Referring to FIG. 2, FIG. 2 schematically illustrates a first structure of a pixel circuit 211*a* according to one or more embodiments of the present disclosure.

The pixel circuit 211*a* includes a fifth storage capacitor Cst, a switch transistor T1, a drive transistor T2, and a first reset transistor T3. A gate of the switch transistor T1 is connected to a switch signal terminal WR, a first electrode of the switch transistor T1 is connected to a data signal line Data, and a second electrode of the switch transistor T1 is connected to a first reset node G. A gate of the drive transistor T2 is connected to the first reset node G, a first electrode of the drive transistor T2 is connected to a constant-voltage high-level source VDD, and a second electrode of the drive transistor T2 is connected to a second reset node S. A gate of the first reset transistor T3 is connected to a first reset terminal INI, a first electrode of the first reset transistor T3 is connected to a first reference potential Vini, and a second electrode of the first reset transistor T3 is connected to a second reset node S. A first plate of the fifth storage capacitor Cst is connected to the first reset node G, and a second plate of the fifth storage capacitor Cst is connected to the second reset node S.

In the structure in FIG. 2, a potential of the second reset node S needs to be reset to a reference potential. Therefore, a control signal for turning on the first reset transistor T3 needs to be input to the gate of the first reset transistor T3 before the switch transistor T1 is turned on.

In one or more embodiments, the first drive module 311 includes a first signal output terminal WR1(*n*) for outputting a first control signal, and the second drive module 321 includes a second signal output terminal INI(n) for outputting a second control signal. The first signal output terminal WR1(*n*) may be connected to the switch signal terminal WR, and the second signal output terminal INI(n) may be connected to the first reset terminal INI.

For example, when k is 1 and j is 2, referring to FIG. 3, a n-th stage first signal output terminal WR1(*n*) is connected to the gate of the switch transistor T1 in the pixel circuit 211*a* of the n-th sub-pixel row 210, and outputs a n-th stage first control signal. A (n+1)-th stage first signal output terminal WR1(*n*+1) is connected to the gate of the switch transistor T1 in the pixel circuit 211*a* of the (n+1)-th sub-pixel row 210, and outputs a (n+1)-th stage first control signal. An a-th stage second signal output terminal INI(a) is connected to the gate of the first reset transistor T3 in the pixel circuit 211*a* of the n-th sub-pixel row 210 and the gate of the first reset transistor T3 in the pixel circuit 211*a* of the (n+1)-th sub-pixel row 210, and outputs an a-th stage second control signal, where a is (n+1)/2.

Figure 4:
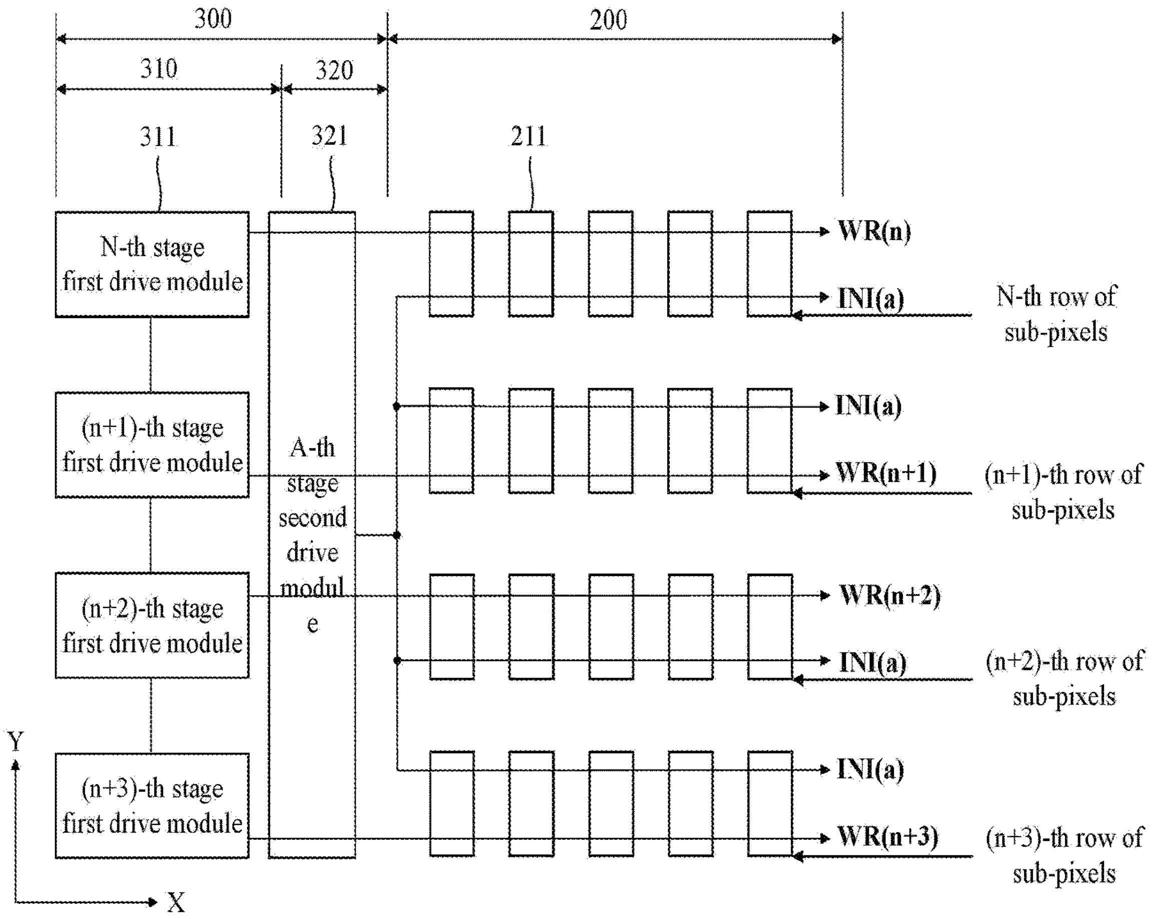
FIG. 4 schematically illustrates a second example of connections between drive circuits in a drive part and sub-pixel rows according to one or more embodiments of the present disclosure.

For example, when k is 1 and j is 4, referring to FIG. 4, the n-th stage first signal output terminal WR1(*n*) is connected to the gate of the switch transistor T1 in the pixel circuit 211*a* of the n-th sub-pixel row 210, and outputs the n-th stage first control signal. The (n+1)-th stage first signal output terminal WR1(*n*+1) is connected to the gate of the switch transistor T1 in the pixel circuit 211*a* of the (n+1)-th sub-pixel row 210, and outputs the (n+1) stage first control signal. A (n+2)-th stage first signal output terminal WR1(*n*+

2) is connected to the gate of the switch transistor T1 in the pixel circuit 211*a* of the (n+2)-th sub-pixel row 210, and outputs a (n+2) stage first control signal. A (n+3)-th stage first signal output terminal WR1(*n*+3) is connected to the gate of the switch transistor T1 in the pixel circuit 211*a* of the (n+3)-th sub-pixel row 210, and outputs a (n+3) stage first control signal. The a-th stage second signal output terminal INI(a) is connected to the gate of the first reset transistor T3 in the pixel circuit 211*a* of each of the n-th sub-pixel row 210 to the (n+3)-th sub-pixel row 210, and outputs the a-th stage second control signal, where a is (n+3)/4.

According to one or more embodiments of the present disclosure, as to the structure in FIG. 3, the number of the second drive modules 321 may be reduced by nearly half compared to the number of the first drive modules 311. According to one or more embodiments of the present disclosure, as to the structure in FIG. 4, the number of the second drive modules 321 may be reduced by nearly three quarters compared to the number of the first drive modules 311. The number of the second drive modules 321 is reduced, so that a large amount of space reserved for the second drive circuit 320 in the second direction Y is left for arranging other driving devices, thereby reducing space on the frame occupied by the drive part 300, and realizing a narrow frame.

Figure 5:
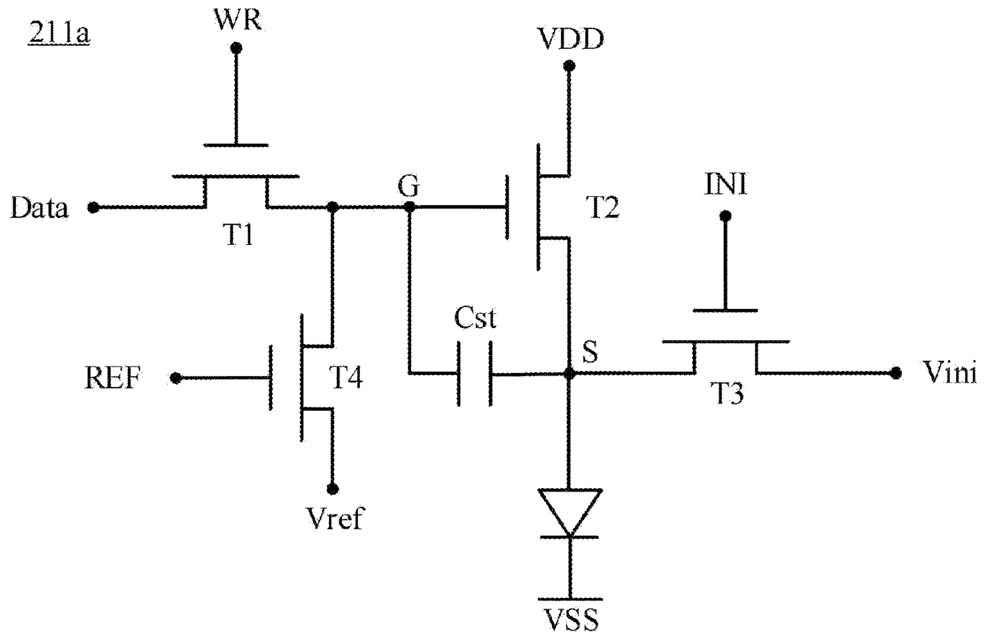
FIG. 5 schematically illustrates a second structure of a pixel circuit according to one or more embodiments of the present disclosure.

Referring to FIG. 5, FIG. 5 schematically illustrates a second structure of the pixel circuit 211*a* according to one or more embodiments of the present disclosure.

The pixel circuit 211*a* includes the fifth storage capacitor Cst, the switch transistor T1, the drive transistor T2, the first reset transistor T3, and a second reset transistor T4. The gate of the switch transistor T1 is connected to the switch signal terminal WR, the first electrode of the switch transistor T1 is connected to the data signal line Data, and the second electrode of the switch transistor T1 is connected to the first reset node G. The gate of the drive transistor T2 is connected to the first reset node G, the first electrode of the drive transistor T2 is connected to the constant-voltage high-level source VDD, and the second electrode of the drive transistor T2 is connected to the second reset node S. The gate of the first reset transistor T3 is connected to the first reset terminal INI, the first electrode of the first reset transistor T3 is connected to the first reference potential Vini, and the second electrode of the first reset transistor T3 is connected to the second reset node S. A gate of the second reset transistor T4 is connected to a second reset terminal REF, a first electrode of the second reset transistor T4 is connected to a second reference potential Vref, and a second electrode of the second reset transistor T4 is connected to the first reset node G. The first plate of the fifth storage capacitor Cst is connected to the first reset node G, and the second plate of the fifth storage capacitor Cst is connected to the second reset node S.

In the structure in FIG. 5, the potentials of the first reset node G and the second reset node S need to be reset to the reference potential. Therefore, before the switch transistor T1 is turned on, a control signal for turning on the first reset transistor T3 needs to be input to the gate of the first reset transistor T3, and a control signal for turning on the second reset transistor T4 needs to be input to the gate of the second reset transistor T4.

Figure 6:
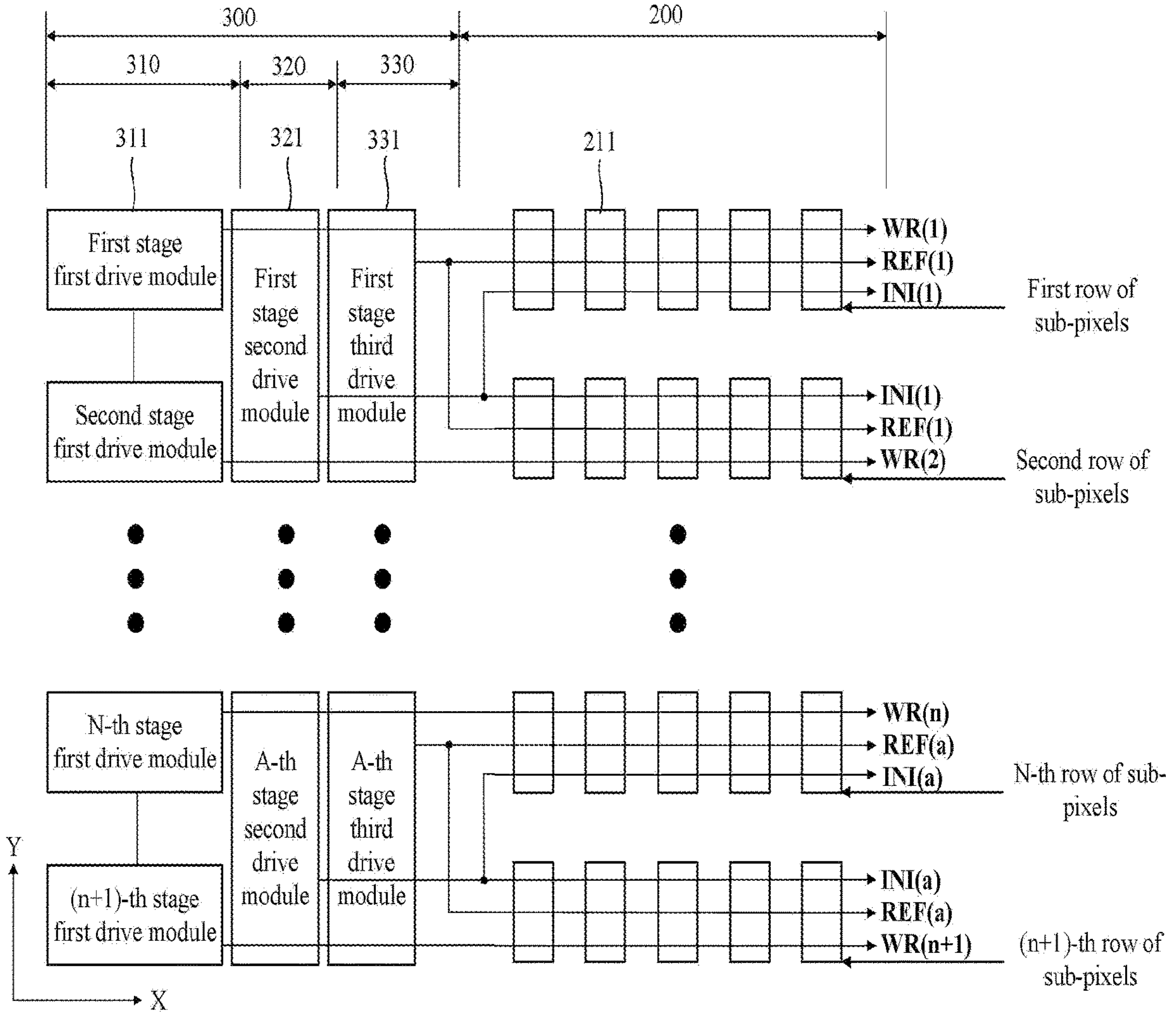
FIG. 6 schematically illustrates a third example of connections between drive circuits in a drive part and sub-pixel rows according to one or more embodiments of the present disclosure.
Figure 8:
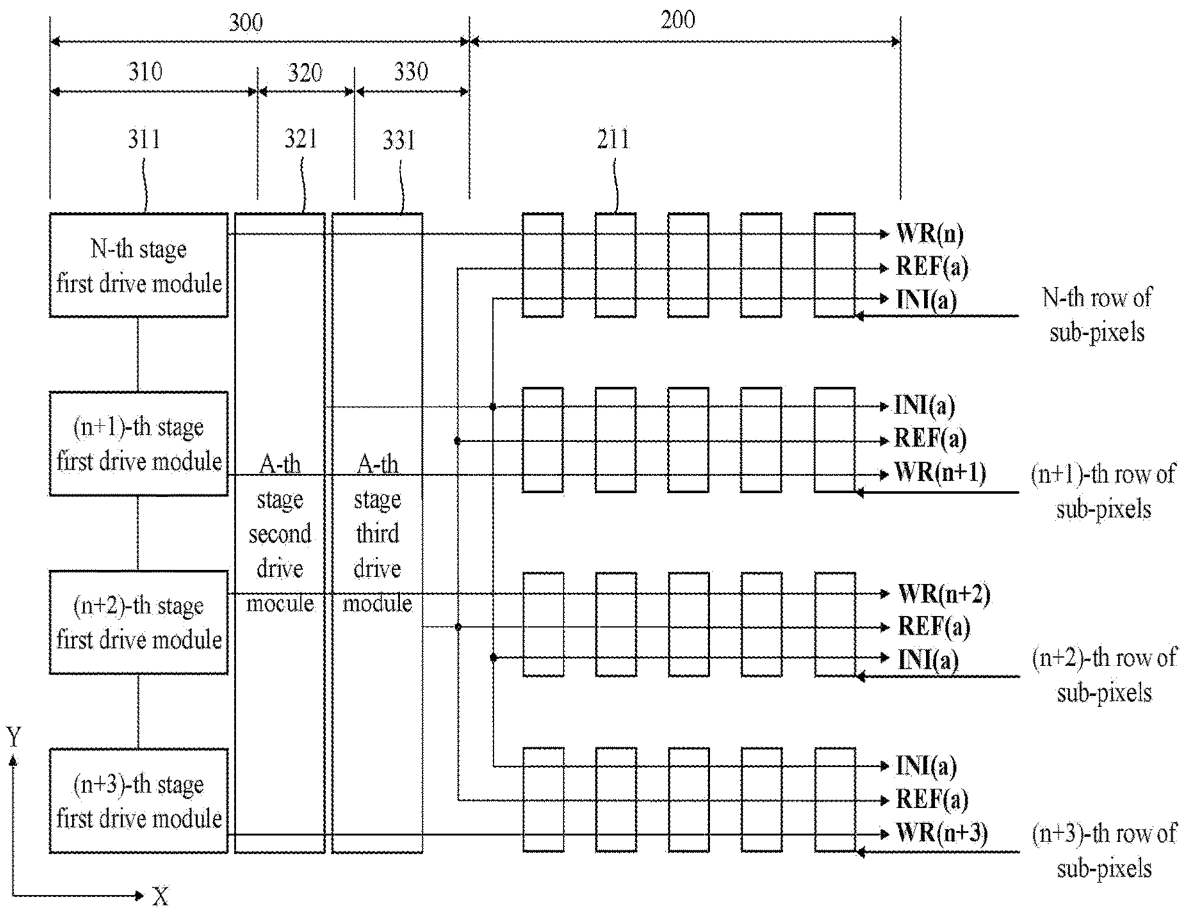
FIG. 8 schematically illustrates a fourth example of connections between drive circuits in a drive part and sub-pixel rows according to one or more embodiments of the present disclosure.

As to the pixel circuit 211*a* in FIG. 5, as shown in FIG. 6 and FIG. 8, the drive part 300 may further include a third drive circuit 330. The first drive circuit 310, the second drive circuit 320, and the third drive circuit 330 are arranged in the first direction X, the third drive circuit 330 includes multiple third drive modules 331 arranged in the second direction Y, and each of the third drive modules 331 includes a fourth signal output terminal REF(n) for outputting a third control signal.

In one or more embodiments, the fourth signal output terminal REF(n) is connected to the gates of the second reset transistors T4 of the pixel circuits 211*a* in j adjacent ones of the sub-pixel rows 210, and the pixel circuit 211*a* of the sub-pixel row 210 to which the a-th stage fourth signal output terminal REF(a) is connected is the same as the pixel circuit 211*a* of the sub-pixel row 210 to which the a-th stage second signal output terminal INI(a) is connected.

Figure 7:
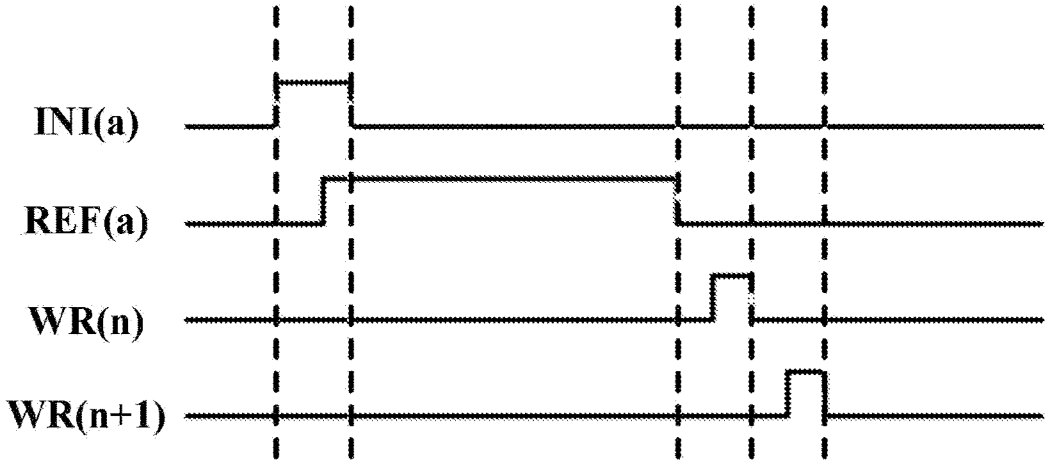
FIG. 7 is a timing diagram of the drive circuits as shown in FIG. 6.

For example, when k is 1 and j is 2, referring to in FIGS. 6 and 7, the n-th stage first signal output terminal WR1(*n*) is connected to the gate of the switch transistor T1 in the pixel circuit 211*a* of the n-th sub-pixel row 210, and outputs the n-th stage first control signal. The (n+1)-th stage first signal output terminal WR1(*n*+1) is connected to the gate of the switch transistor T1 in the pixel circuit 211*a* of the (n+1)-th sub-pixel row 210, and outputs the (n+1)-th stage first control signal. The a-th stage second signal output terminal INI(a) is connected to the gate of the first reset transistor T3 in the pixel circuit 211*a* of each of the n-th sub-pixel row 210 and the (n+1)-th sub-pixel row 210, and outputs the a-th stage second signal output terminal REF(a), where a is (a+1)/2. The a-th stage fourth signal output terminal REF(a) is connected to the gate of the second reset transistor T4 in the pixel circuit 211*a* of each of the n-th sub-pixel row 210 and the (n+1)-th sub-pixel row 210, and outputs an a-th stage third control signal, where a is (a+1)/2.

Figure 9:
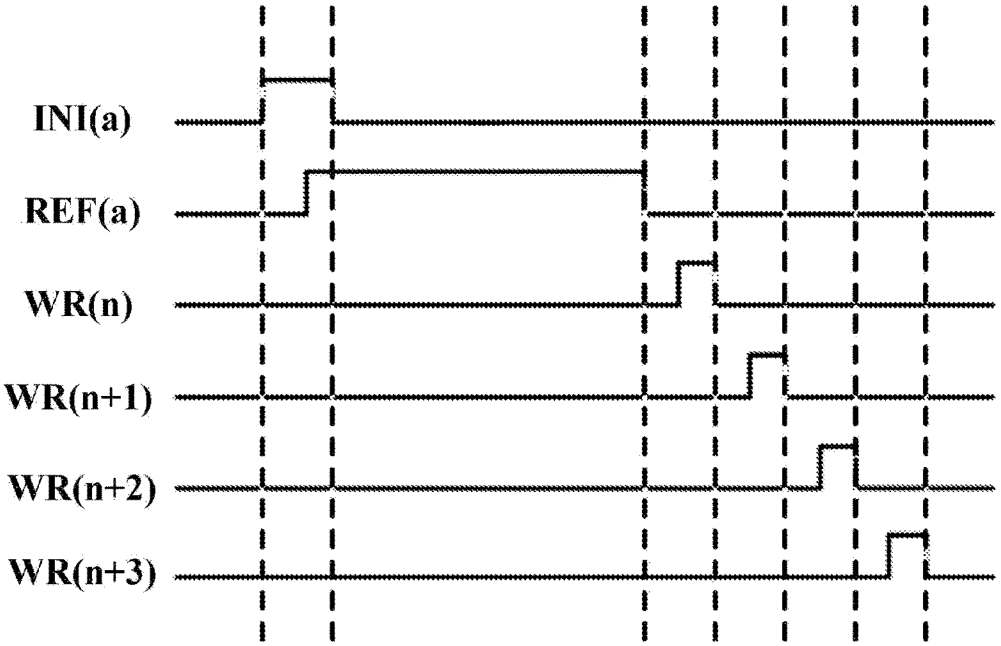
FIG. 9 is a timing diagram of the drive circuits as shown in FIG. 8.

For example, when k is 1 and j is 4, referring to FIGS. 8 and 9, the n-th stage first signal output terminal WR1(*n*) is connected to the gate of the switch transistor T1 in the pixel circuit 211*a* of the n-th sub-pixel row 210, and outputs the n-th stage first control signal. The (n+1)-th stage first signal output terminal WR1(*n*+1) is connected to the gate of the switch transistor T1 in the pixel circuit 211*a* of the (n+1)-th sub-pixel row 210, and outputs the (n+1)-th stage first control signal. The (n+2)-th stage first signal output terminal WR1(*n*+2) is connected to the gate of the switch transistor T1 in the pixel circuit 211*a* of the (n+2)-th sub-pixel row 210, and outputs the (n+2)-th stage first control signal. The (n+3)-th stage first signal output terminal WR1(*n*+3) is connected to the gate of the switch transistor T1 in the pixel circuit 211*a* of the (n+3)-th sub-pixel row 210, and outputs the (n+3)-th stage first control signal. The a-th stage second signal output terminal INI(a) is connected to the gate of the first reset transistor T3 in the pixel circuit 211*a* of each of the n-th sub-pixel row 210 to the (n+3)-th sub-pixel row 210, and outputs the a-th stage second control signal. The a-th stage fourth signal output terminal REF(a) is connected to the gate of the second reset transistor T4 in the pixel circuit 211*a* of each of the n-th sub-pixel row 210 to the (n+3)-th sub-pixel row 210, and outputs the a-th stage third control signal, where a is (n+3)/4.

According to one or more embodiments of the present disclosure, as to the structure in FIG. 6, both the number of the second drive modules 321 and the number of the third drive modules 331 are reduced by nearly half compared to the number of the first drive modules 311. According to one or more embodiments of the present disclosure, as to the structure in FIG. 8, both the number of the second drive modules 321 and the number of the third drive modules 331 are reduced by nearly three quarters compared to the number of the first drive modules 311. Both the number of the second drive modules 321 and the number of the third drive modules 331 are reduced, so that a large amount of space reserved for the second drive circuit 320 and the third drive circuit 320 in the second direction Y is left for arranging other driving devices, thereby reducing space on the frame occupied by the drive part 300, and realizing a narrow frame.

Referring to FIGS. 3 and 4, the number of the first drive modules 311 is greater than the number of the second drive modules 321. Since the number of the second drive modules 321 is reduced, the width of the second drive module 321 in the first direction X is reduced, that is, in the first direction X, the width of the first drive module 311 is greater than the width of the second drive module 321, and in the second direction Y, the length of the first drive module 311 is less than the length of the second drive module 321. Therefore, according to one or more embodiments of the present disclosure, the transverse width of the second drive module 321 is reduced but the longitudinal length of the second drive module 321 is increased, so that the longitudinal length of the first drive circuit 310 may be equal to the longitudinal length of the second drive circuit 320, thereby reducing transverse space on the frame occupied by the second drive module 321, and realizing a narrow frame. Similarly, referring to FIGS. 6 and 8, the number of the second drive module 321 may be equal to the number of the third drive module 331, that is, in the first direction X, the width of the first drive module 311 is greater than the width of the third drive module 331, and in the second direction Y, the length of the first drive module 311 is less than the length of the third drive module 331, that is, the transverse width of the third drive module 331 is reduced but the longitudinal length of the third drive module 331 is increased, so that the longitudinal length of the first drive circuit 310 may be equal to the longitudinal length of the third drive circuit 330, thereby reducing the transverse space on the frame occupied by the third drive module 331 of the display panel 100, and further reducing the frame of the display panel 100.

In one or more embodiments, the first drive module 311 may include the first signal output terminal WR1(*n*) for outputting the first control signal and a third signal output terminal WR2(*n*+1) for outputting the first control signal, and the second drive module 321 includes the second signal output terminal INI(n) for outputting the second control signal. Both the first signal output terminal WR1(*n*) and the third signal output terminal WR2(*n*+1) may be connected to the switch signal terminal WR, and the second signal output terminal INI(n) may be connected to the first reset terminal INI.

Note that although both the first signal output terminal WR1(*n*) and the third signal output terminal WR2(*n*+1) output the first control signal for opening the switch transistor T1, the first control signal output by the first signal output terminal WR1(*n*) has a phase difference with the first control signal output by the third signal output terminal WR2(*n*+1). For example, the n-th stage first signal output terminal WR1(*n*) outputs the n-th stage first control signal, and the n-th stage third signal output terminal WR2(*n*+1) outputs the (n+1)-th stage first control signal. The switch transistors T1 of the n-th sub-pixel row 210 and the switch transistors T1 of the (n+1)-th sub-pixel row 210 are not turned on at the same time. The first reset transistors T3 of the n-th sub-pixel row 210 and the first reset transistors T3 of the (n+1)-th sub-pixel row 210 are turned on at the same time, and the second reset transistors T4 of the n-th sub-pixel row 210 and the second reset transistors T4 of the (n+1)-th sub-pixel row 210 are turned on at the same time.

Figure 10:
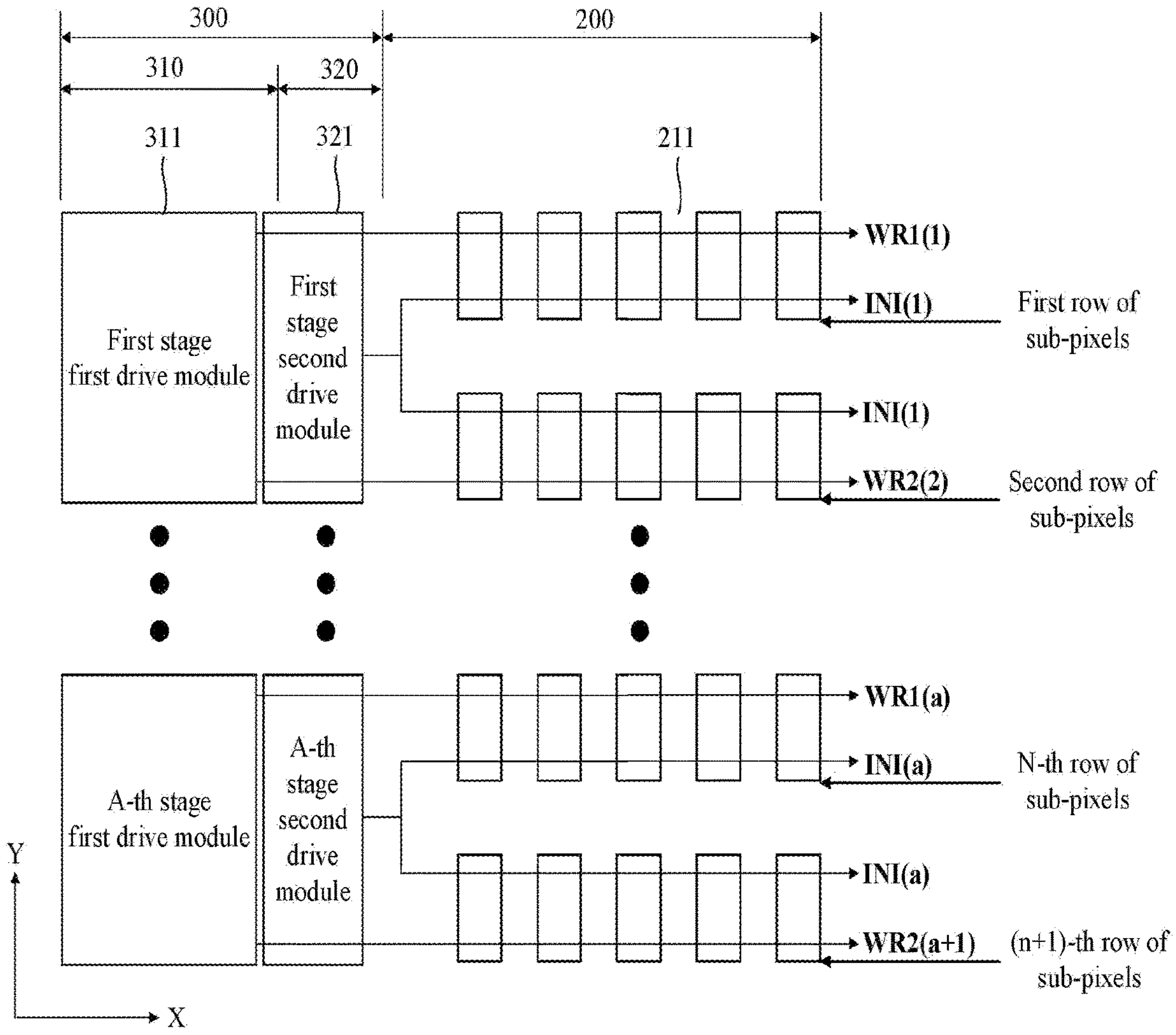
FIG. 10 schematically illustrates a fifth example of connections between drive circuits in a drive part and sub-pixel rows according to one or more embodiments of the present disclosure.

For example, when the pixel circuit 211*a* is configured as shown in FIG. 2, and k is 2 and j is 2, referring to FIG. 10, a b-th stage first signal output terminal WR1(*b*) is connected to the gate of the switch transistor T1 in the pixel circuit 211*a* of the n-th row sub-pixel row 210, that is, the first control signal is output to the n-th sub-pixel row 210. The b-th stage third signal output terminal WR2(*b*+1) is connected to the gate of the switch transistor T1 in the pixel circuit 211*a* of the (n+1)-th sub-pixel row 210, that is, the first control signal is output to the (n+1)-th sub-pixel row 210. The a-th stage second signal output terminal INI(a) is connected to the gate of the first reset transistor T3 in the pixel circuit 211*a* of each of the n-th sub-pixel row 210 and the (n+1)-th sub-pixel row 210, that is, the second control signal is output to each of the n-th sub-pixel row 210 and the (n+1)-th sub-pixel row 210, where a is equal to b, and a is (n+1)/2.

Figure 11:
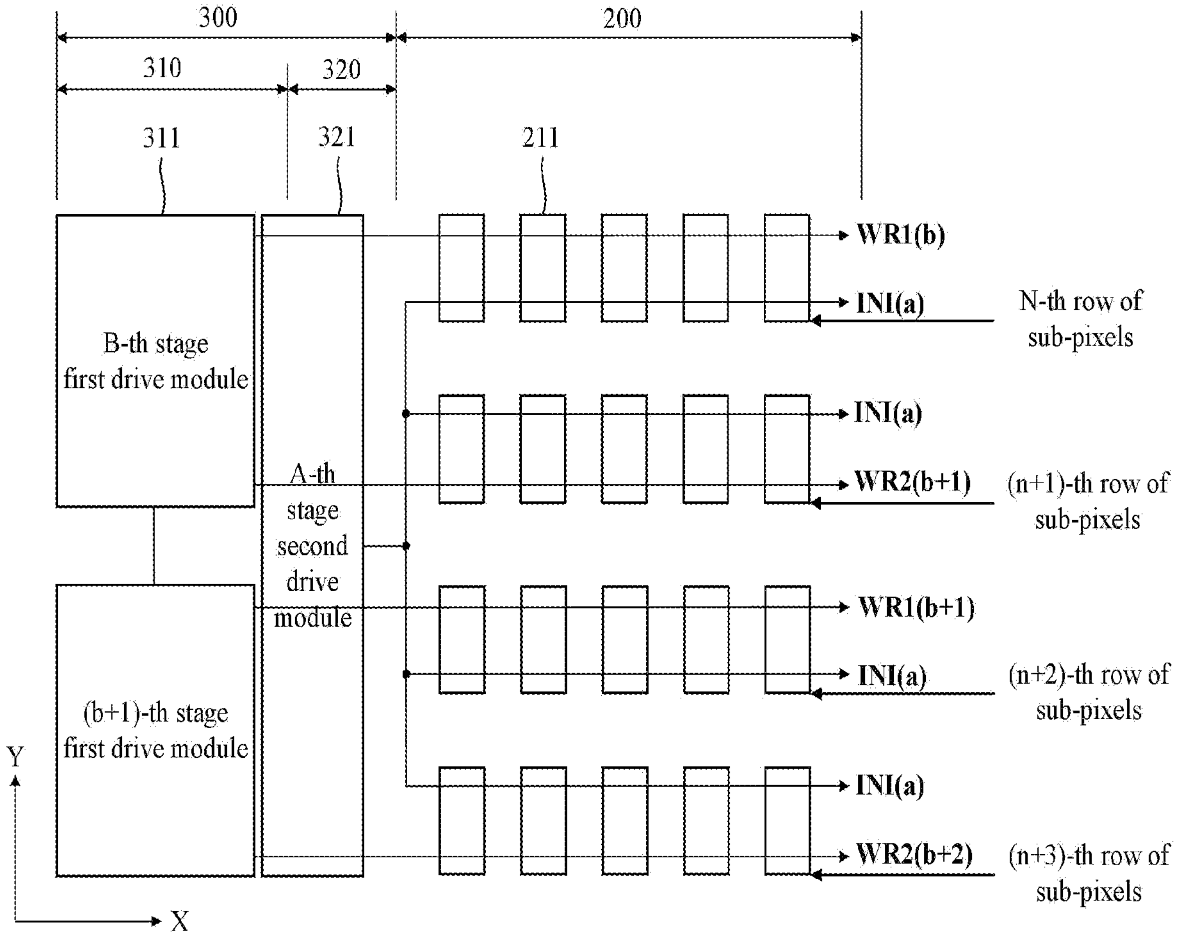
FIG. 11 schematically illustrates a sixth example of connections between drive circuits in a drive part and sub-pixel rows according to one or more embodiments of the present disclosure.

When the pixel circuit 211*a* is configured as shown in FIG. 2, and k is 2 and j is 4, referring to FIG. 11, the b-th stage first signal output terminal WR1(*b*) is connected to the gate of the switch transistor T1 in the pixel circuit 211*a* of the n-th sub-pixel row 210, that is, the first control signal is output to the n-th sub-pixel row 210. The b-th stage third signal output terminal WR2(*b*+1) is connected to the gate of the switch transistor T1 in the pixel circuit 211*a* of the (n+1)-th sub-pixel row 210, that is, the first control signal is output to the (n+1)-th sub-pixel row 210. The (b+1)-th stage first signal output terminal WR1(*b*+1) is connected to the gate of the switch transistor T1 in the pixel circuit 211*a* of the (n+2)-th sub-pixel row 210, that is, the first control signal is output to the (n+2)-th sub-pixel row 210. The (b+1)-th stage third signal output terminal WR2(*b*+2) is connected to the gate of the switch transistor T1 in the pixel circuit 211*a* of the (n+3)-th sub-pixel row 210, that is, the first control signal is output to the (n+3)-th sub-pixel row 210. The a-th stage second signal output terminal INI(a) is connected to the gate of the first reset transistor T3 in the pixel circuit 211*a* of each of the n-th sub-pixel row 210 to the (n+3)-th sub-pixel row 210, that is, the second control signal is output to each of the n-th sub-pixel row 210 to the (n+3)-th sub-pixel row 210, where b is (n+1)/2, and a is (n+3)/4.

Figure 12:
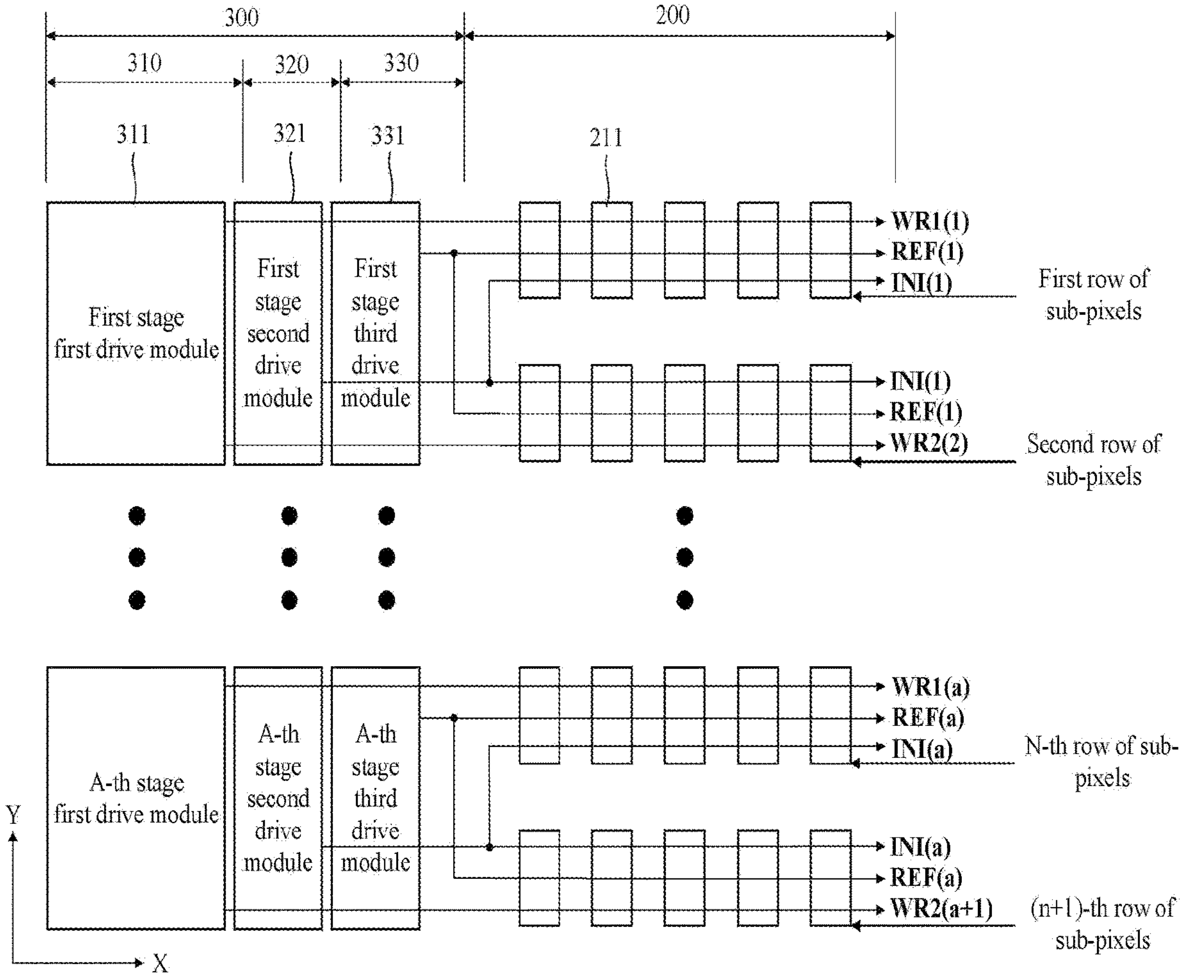
FIG. 12 schematically illustrates a seventh example of connections between drive circuits in a drive part and sub-pixel rows according to one or more embodiments of the present disclosure.

When the pixel circuit 211*a* is configured as shown in FIG. 5, and k is 2 and j is 2, referring to FIG. 12, the b-th stage first signal output terminal WR1(*b*) is connected to the gate of the switch transistor T1 in the pixel circuit 211*a* of the n-th sub-pixel row 210, that is, the first control signal is output to the n-th row sub-pixel row 210. The b-th stage third signal output terminal WR2(*b*+1) is connected to the gate of the switch transistor T1 in the pixel circuit 211*a* of the (n+1)-th sub-pixel row 210, that is, the first control signal is output to the (n+1)-th sub-pixel row 210. The a-th stage second signal output terminal INI(a) is connected to the gate of the first reset transistor T3 in the pixel circuit 211*a* of each of the n-th sub-pixel row 210 and the (n+1)-th sub-pixel row 210, that is, the second control signal is output to each of the n-th sub-pixel row 210 and the (n+1)-th sub-pixel row 210. An a-th stage fourth signal output terminal REF(a) is connected to the gate of the second reset transistor T4 in the pixel circuit 211*a* of each of the n-th sub-pixel row 210 and the (n+1)-th sub-pixel row 210, that is, the third control signal is output to each of the n-th sub-pixel row 210 and the (n+1)-th sub-pixel row 210, where a is equal to b, and a is (n+1)/2.

Figure 13:
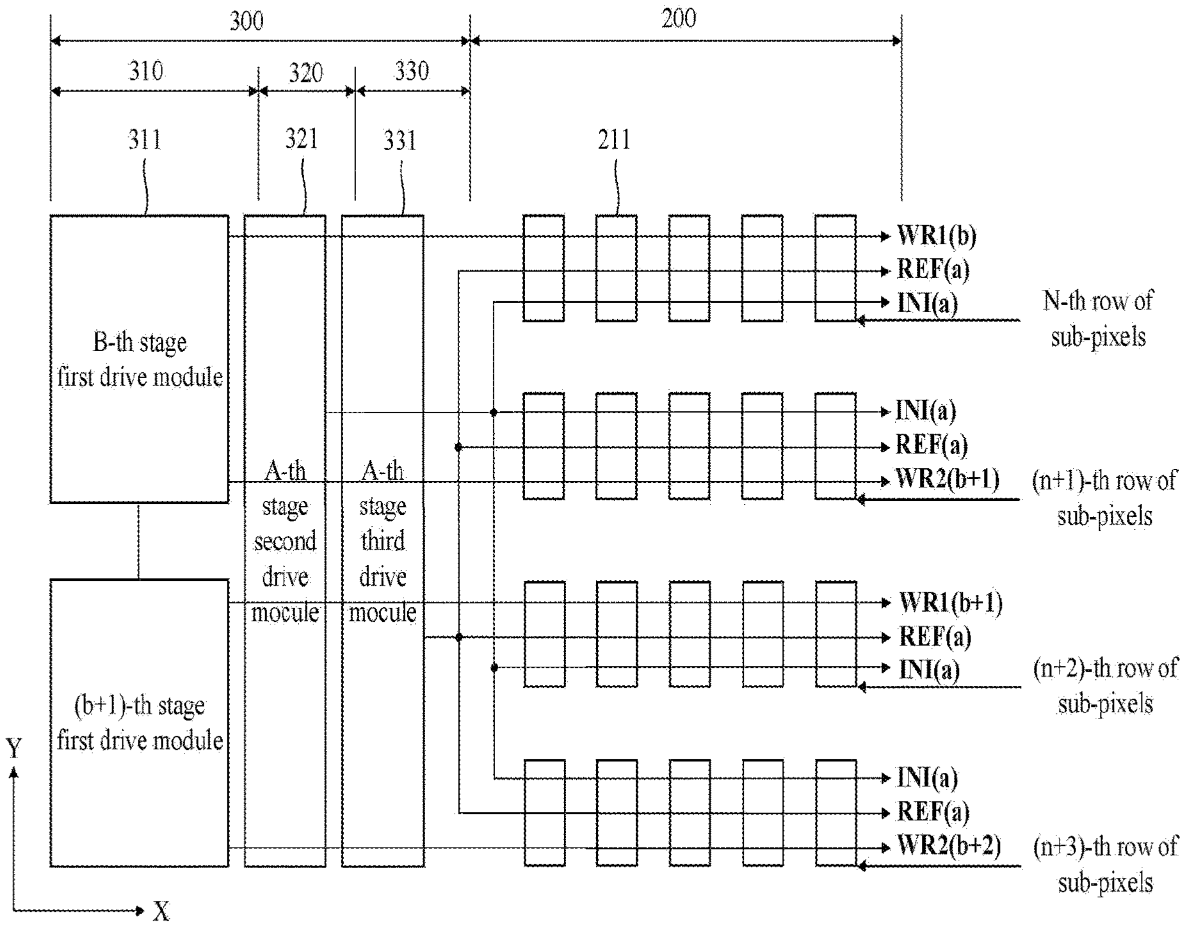
FIG. 13 schematically illustrates an eighth example of connections between drive circuits in a drive part and sub-pixel rows according to one or more embodiments of the present disclosure.

When the pixel circuit 211*a* is configured as shown in FIG. 5, and k is 2 and j is 4, referring to FIG. 13, the b-th stage first signal output terminal WR1(*b*) is connected to the gate of the switch transistor T1 in the pixel circuit 211*a* of the n-th sub-pixel row 210, that is, the first control signal is output to the n-th sub-pixel row 210. The b-th stage third signal output terminal WR2(*b*+1) is connected to the gate of the switch transistor T1 in the pixel circuit 211*a* of the (n+1)-th sub-pixel row 210, that is, the first control signal is output to the (n+1)-th sub-pixel row 210. The (b+1)-th stage first signal output terminal WR1(*b*+1) is connected to the gate of the switch transistor T1 in the pixel circuit 211*a* of the (n+2)-th sub-pixel row 210, that is, the first control signal is output to the (n+2)-th sub-pixel row 210. The (b+1)-th stage third signal output terminal WR2(*b*+2) is connected to the gate of the switch transistor T1 in the pixel circuit 211*a* of the (n+3)-th sub-pixel row 210, that is, the first control signal is output to the (n+3)-th sub-pixel row 210. The a-th stage second signal output terminal INI(a) is connected to the gate of the first reset transistor T3 in the pixel circuit 211*a* of each of the n-th sub-pixel row 210 to the (n+3)-th sub-pixel row 210, that is, the second control signal is output to each of the n-th sub-pixel row 210 to the (n+3)-th sub-pixel row 210. The a-th stage fourth signal output terminal REF(a) is connected to the gate of the second reset transistor T4 in the pixel circuit 211*a* of each of the n-th sub-pixel row 210 to the (n+3)-th sub-pixel row 210, that is, the third control signal is output to each of the n-th sub-pixel row 210 to the (n+3)-th sub-pixel row 210, where b is (n+1)/2 and a is (n+3)/4.

Referring to FIGS. 10 and 12, the number of the first drive modules 311 is equal to the number of the second drive modules 321. Since the number of the second drive modules 321 is reduced, the width of the second drive module 321 in the first direction X is reduced, that is, in the first direction X, the width of the first drive module 311 is greater than the width of the second drive module 321, and in the second direction Y, the length of the first drive module 311 is less than the length of the second drive module 321. Therefore, according to one or more embodiments of the present disclosure, the transverse width of the second drive module 321 is reduced but the longitudinal length of the second drive module 321 is increased, so that the longitudinal length of the first drive circuit 310 may be equal to the longitudinal length of the second drive circuit 320, thereby reducing transverse space on the frame of the display panel 100 occupied by the second drive module 321, and realizing a narrow frame. Similarly, referring to FIGS. 11 and 13, the number of the second drive module 311 may be less than the number of the third drive module 321. The number of the third drive module 321 is further reduced, thereby reducing the frame of the display panel 100. Similarly, relevant definitions of the third drive module 331 and the first drive module 311 are same as relevant definitions of the second drive module 321 and the first drive module 311.

According to one or more embodiments of the present disclosure, in the structures in FIGS. 3, 4, and 6 to 13, the configurations of the first drive module 311, the second drive module 321, and the third drive module 331 are not specifically limited. However, the first drive module 311, the second drive module 321, and the third drive module 331 may each have a pull-up control unit, a pull-up unit, a pull-down unit, and a pull-down maintenance unit that are electrically connected to a same control node, which is not limited herein. The following explains structures of the first drive module 311, the second drive module 321, and the third drive module 331 according to one or more embodiments of the present disclosure by a specific circuit structure.

Figure 14:
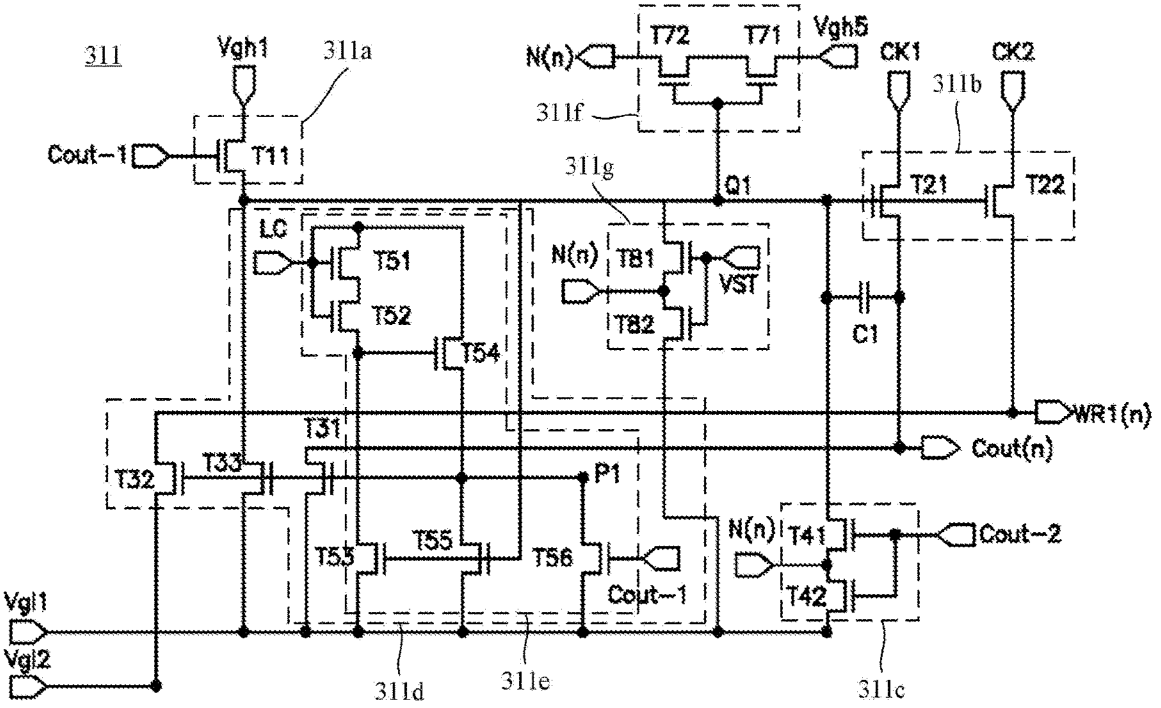
FIG. 14 is a circuit diagram of a first example of a first drive module according to one or more embodiments of the present disclosure.

For example, as to the first drive module 311 in FIGS. 3, 4, 6, and 8, referring to FIG. 14, the first drive module 311 may include a first pull-up control unit 311*a*, a first pull-up unit 311*b*, a first pull-down unit 311*c*, and a first pull-down maintenance unit 311*d*.

In the structure in FIG. 14, the first pull-up control unit 311*a* includes a first pull-up control transistor T11. The first pull-up control transistor T11 has a gate connected to a first cascade signal line Cout1, a first electrode connected to a first high-potential line Vgh1, and a second electrode connected to a first control node Q1.

In the structure in FIG. 14, the first pull-up unit 311*b* includes a first pull-up transistor T21, a second pull-up transistor T22, and a first storage capacitor C1. A first electrode of the first pull-up transistor T21 is connected to a first clock signal line CK1, a second electrode of the first pull-up transistor T21 is connected to a cascade signal terminal Cout(n), a first electrode of the second pull-up transistor T22 is connected to a second clock signal line CK2, a second electrode of the second pull-up transistor T22 is connected to the first signal output terminal WR1(*n*), a gate of the first pull-up transistor T21, a gate of the second pull-up transistor T22, and a first plate of the first storage capacitor C1 are all connected to the first control node Q1, and a second plate of the first storage capacitor C1 is connected to the cascade signal terminal Cout(n);

In the structure in FIG. 14, the first pull-down unit 311*c* includes a first pull-down transistor T41 and a second pull-down transistor T42. Both a gate of the first pull-down transistor T41 and a gate of the second pull-down transistor T42 are connected to a second cascade signal line Cout2, a first electrode of the first pull-down transistor T41 is connected to the first control node Q1, a second electrode of the first pull-down transistor T41 is connected to a first electrode of the second pull-down transistor T42, and a second electrode of the second pull-down transistor T42 is connected to a first low-potential line Vgl1.

In the structure in FIG. 14, the first pull-down sustaining unit 311*d* includes a first pull-down maintenance transistor T31, a second pull-down maintenance transistor T32, a third pull-down maintenance transistor T33, and a first inverter 311*e*. A gate of the first pull-down maintenance transistor T31, a gate of the second pull-down maintenance transistor T32, a gate of the third pull-down maintenance transistor T33, and the first inverter 311*e* are all connected to a second control node P1, a first electrode of the first pull-down maintenance transistor T31 is connected to a second electrode of the first pull-up transistor T21, a second electrode of the first pull-down maintenance transistor T31 is connected to the first low-potential line Vgl1, a first electrode of the second pull-down maintenance transistor T32 is connected to the second electrode of the second pull-up transistor T22, a second electrode of the second pull-down maintenance transistor T32 is connected to a second low-potential line Vgl2, a first electrode of the third pull-down maintenance transistor T33 is connected to the first control node Q1, a second electrode of the third pull-down maintenance transistor T33 is connected to the first low-potential line Vgl1, and the first inverter 311*e* is configured to invert potentials of the first control node Q1 and the second control node P1.

In the structure in FIG. 14, the first inverter 311*e* includes a first inversion transistor T51, a second inversion transistor T52, a third inversion transistor T53, a fourth inversion transistor T54, a fifth inversion transistor T55, and a sixth inversion transistor T56. A first electrode of the first inversion transistor T51, a gate of the first inversion transistor T51, a gate of the second inversion transistor T52, and a first electrode of the fourth inversion transistor T54 are all connected to a low frequency clock signal line LC, a second electrode of the first inversion transistor T51 is connected to a first electrode of the second inversion transistor T52, a second electrode of the second inversion transistor T52 is connected to a first electrode of the third inversion transistor T53 and a gate of the fourth inversion transistor T54, a second electrode of the third inversion transistor T53 is connected to the first low-potential line Vgl1, a second electrode of the fourth inversion transistor T54, a first electrode of the fifth inversion transistor T55, and a first electrode of the sixth inversion transistor T56 are all connected to a second control node P1, a second electrode of the fifth inversion transistor T55 and a second electrode of the sixth inversion transistor T56 are connected to the first low-potential line Vgl1, both a gate of the third inversion transistor T53 and a gate of the fifth inversion transistor T55 are connected to the first control node Q1, and a gate of the sixth inversion transistor T56 is connected to the first cascade signal line Cout1.

In the structure in FIG. 14, the first drive module 311 further includes a first leakage prevention unit 311*f* connected to the first control node Q1. The first leakage prevention unit 311*f* includes a first leakage prevention transistor T71 and a second leakage prevention transistor T72. A first electrode of the first leakage prevention transistor T71 is connected to a fifth high-potential line Vgh5, a second electrode of the first leakage prevention transistor T71 is connected to a first electrode of the second leakage prevention transistor T72, a second electrode of the second leakage prevention transistor T72 is connected to an output terminal N(n) of the first leakage prevention unit 311*f*, and both a gate of the first leakage prevention transistor T71 and a gate of a second leakage prevention transistor T72 are connected to the first control node Q1.

In the structure in FIG. 14, the first drive module 311 further includes a first global reset unit 311*g* including a first reference transistor T81 and a second reference transistor T82. A first electrode of the first reference transistor T81 is connected to the first control node Q1, a second electrode of the first reference transistor T81 and a first electrode of the second reference transistor T82 is connected to the output terminal N(n) of the leakage prevention unit 150, a second electrode of the second reference transistor T82 is connected to the first low-potential line Vgl1, both a gate of the first reference transistor T81 and a gate of the second reference transistor T82 are connected to a control signal line VST. The first global reset unit 311*g* generally resets the potential of the first control node Q1 when the first drive module 311 ends or starts working.

In one or more embodiments, both the second electrode of the first pull-down transistor T41 and the first electrode of the second pull-down transistor T42 may be connected to the output terminal N(n) of the first leakage prevention unit 311*f* to reduce leakage current. Also, the third pull-down sustain transistor T33 may be provided with two transistors in series, and the output terminal N(n) of the first leakage prevention unit 311*f* is connected between the two transistors, thereby further reducing the leakage current.

It should be noted that according to one or more embodiments in the present disclosure, only one of the two transistors in series may be provided. For example, only one of the first inversion transistor T51 and the second inversion transistor T52 may be provided. The leakage current may be reduced by providing the first inversion transistor T51 and the second inversion transistor T52, and the sixth inversion transistor T56 is mainly used to feedback, and may not be a part of the inverter.

Note that the first cascade signal line Cout1 may be a cascade signal output from an intermediate cascade signal terminal Cout(n) of a previous stage, for example, a cascade signal output from the cascade signal terminal Cout(n) of a (n−x)-th stage first drive module 311, where x may be 2. The second-stage signal line Cout2 may be a stage signal output from the intermediate-cascade signal terminal Cout(n) of a later stage, for example, a stage signal output from the cascade signal terminal Cout(n) of a (n+y)-th stage first drive module 311, where y may be 2.

Figure 15:
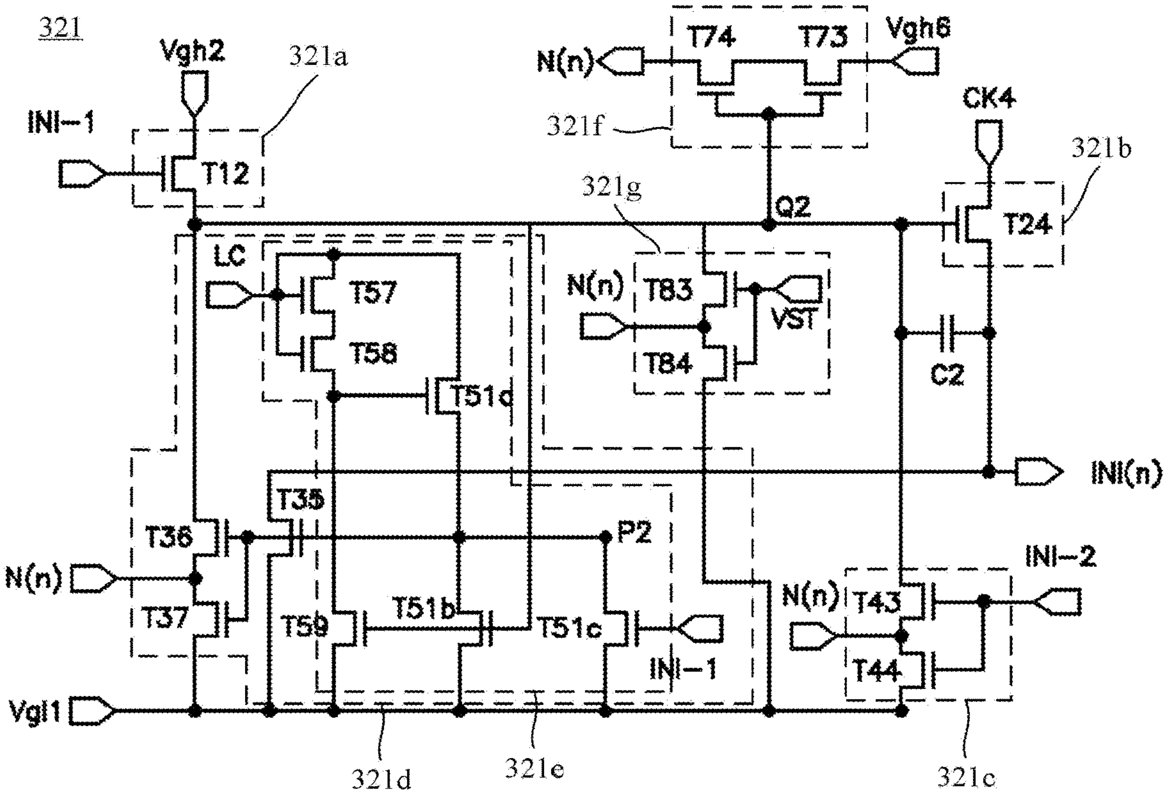
FIG. 15 is a circuit diagram of a second drive module according to one or more embodiments of the present disclosure.

For example, as to the second drive module 321 in FIGS. 3, 4, and 6 to 13, referring to FIG. 15, the second drive module 321 includes a second pull-up control unit 321*a*, a second pull-up unit 321*b*, a second pull-down unit 321*c*, and a second pull-down maintenance unit 321*d*.

In the structure in FIG. 15, the second pull-up control unit 321*a* includes a second pull-up control transistor T12. A gate of the second pull-up control transistor T12 is connected to a first signal transmission line INI-1, a first electrode of the second pull-up control transistor T12 is connected to a second high-potential line Vgh2, and a second electrode of the second pull-up control transistor T12 is connected to the third control node Q2.

In the structure in FIG. 15, the second pull-up unit 321*b* includes a fourth pull-up transistor T24 and a second storage capacitor C2. A first electrode of the fourth pull-up transistor T24 is connected to a fourth clock signal line CK4, a second electrode of the fourth pull-up transistor T24 is connected to the second signal output terminal INI(n), both a gate of the fourth pull-up transistor T24 and a first plate of the are connected to the third control node Q2, and a second plate of the second storage capacitor C2 is connected to the second signal output terminal INI(n).

In the structure in FIG. 15, the second pull-down unit 321*c* includes a third pull-down transistor T43 and a fourth pull-down transistor T44. Both a gate of the third pull-down transistor T43 and a gate of the fourth pull-down transistor T44 are connected to the second signal transmission line INI-2, a first electrode of the third pull-down transistor T43 is connected to the third control node Q2, a second electrode of the third pull-down transistor T43 is connected to a first electrode of the fourth pull-down transistor T44, and a second electrode of the fourth pull-down transistor T44 is connected to the first low-potential line Vgl1.

In the structure in FIG. 15, the second pull-down sustaining unit 321*d* includes a fifth pull-down maintenance transistor T35, a sixth pull-down maintenance transistor T36, a seventh pull-down maintenance transistor T37, and a second inverter 321*e*. A gate of the fifth pull-down maintenance transistor T35, a gate of the sixth pull-down maintenance transistor T36, a gate of the seventh pull-down maintenance transistor T37, and the second inverter 321*e* are all connected to a fourth control node P2, a first electrode of the fifth pull-down maintenance transistor T35 is connected to a second electrode of the fourth pull-up transistor T24, a second electrode of the fifth pull-down maintenance transistor T35 is connected to the first low-potential line Vgl1, a first electrode of the sixth pull-down maintenance transistor T36 is connected to the third control node Q2, a second electrode of the sixth pull-down maintenance transistor T36 is connected to a first electrode of the seventh pull-down maintenance transistor T37, a second electrode of the seventh pull-down maintenance transistor T37 is connected to the first low-potential line Vgl1, and the second inverter 321*e* is used to invert potentials of the third control node Q2 and the fourth control node P2.

In the structure in FIG. 15, the second inverter 321*e* includes a seventh inversion transistor T57, an eighth inversion transistor T58, a ninth inversion transistor T59, a tenth inversion transistor T51*a*, an eleventh inversion transistor T51*b*, and a twelfth inversion transistor T51*c*. A first electrode of the seventh inversion transistor T57, a gate of the seventh inversion transistor T57, a gate of the eighth inversion transistor T58, and a first electrode of the tenth inversion transistor T51*a* are all connected to the low frequency clock signal line LC, a second electrode of the seventh inversion transistor T57 is connected to a first electrode of the eighth inversion transistor T58, a second electrode of the eighth inversion transistor T58 is connected to a first electrode of the ninth inversion transistor T59 and a gate of the tenth inversion transistor T51*a*, a second electrode of the ninth inversion transistor T59 is connected to the first low-potential line Vgl1, a second electrode of the tenth inversion transistor T51*a*, a first electrode of the eleventh inversion transistor T51*b*, and a first electrode of the twelfth inversion transistor T51*c* are all connected to the fourth control node P2, both a second electrode of the eleventh inversion transistor T51*b* and a second electrode of the twelfth inversion transistor T51*c* are connected to the first low-potential line Vgl1, both a gate of the ninth inversion transistor T59 and a gate of the eleventh inversion transistor T51*b* are connected to the third control node Q2, and a gate of the twelfth inversion transistor T51*c* is connected to the first signal transmission line INI-1.

In the structure in FIG. 15, the second drive module 321 further includes a second leakage prevention unit 321*f* connected to the third control node Q2. The second leakage prevention unit 321*f* includes a third leakage prevention transistor T73 and a fourth leakage prevention transistor T74. A first electrode of the third leakage prevention transistor T73 is connected to a sixth high-potential line Vgh6, a second electrode of the third leakage prevention transistor T73 is connected to a first electrode of the fourth leakage prevention transistor T74, a second electrode of the fourth leakage prevention transistor T74 is connected to an output terminal N(n) of the second leakage prevention unit 321*f*, and both a gate of the third leakage prevention transistor T73 and a gate of the fourth leakage prevention transistor T74 are connected to the third control node Q2.

In the structure in FIG. 15, the second drive module 321 further includes a second global reset unit 321*g* including a third reference transistor T83 and a fourth reference transistor T84. A first electrode of the third reference transistor T83 is connected to the third control node Q2, both a second electrode of the third reference transistor T83 and a first electrode of the fourth reference transistor T84 are connected to the output terminal N(n) of the second leakage prevention unit 321*f*, a second electrode of the fourth reference transistor T84 is connected to the first low-potential line Vgl1, both a gate of the third reference transistor T83 and a gate of the fourth reference transistor T84 are connected to the control signal line VST. The second global reset unit 321*g* generally resets the potential of the third control node Q2 when the second drive module 321 ends or starts working.

In one or more embodiments, the second electrode of the sixth pull-down maintenance transistor T36, the first electrode of the seventh pull-down maintenance transistor T37, the second electrode of the third pull-down transistor T43, and the first electrode of the fourth pull-down transistor T44 may all be connected to the output terminal N(n) of the second leakage prevention unit 321*f* to reduce the leakage current.

It should be noted that according to one or more embodiments of the present disclosure, only one of the two transistors in series may be provided, for example, only one of the seventh inversion transistor T57 and the eighth inversion transistor T58 may be provided. The leakage current may be reduced by providing the seventh inversion transistor T57 and the eighth inversion transistor T58, and the twelfth inversion transistor T51*c* is mainly used to feedback, and may not be a part of the inverter 160.

Note that the first signal transmission line INI-1 may be a second control signal outputted from an immediate second signal output terminal INI(n) of a previous stage, for example, a second control signal outputted from an (n−x)-th stage second signal output terminal INI(n) of the second drive module 321, where x may be 2. The second signal transmission line INI-2 may be a second control signal outputted from an immediate second signal output terminal INI(n) of a later stage, for example, a second control signal outputted from an (n+y)-th stage second signal output terminal INI(n) of the second drive module 321, where y may be 2.

Figure 16:
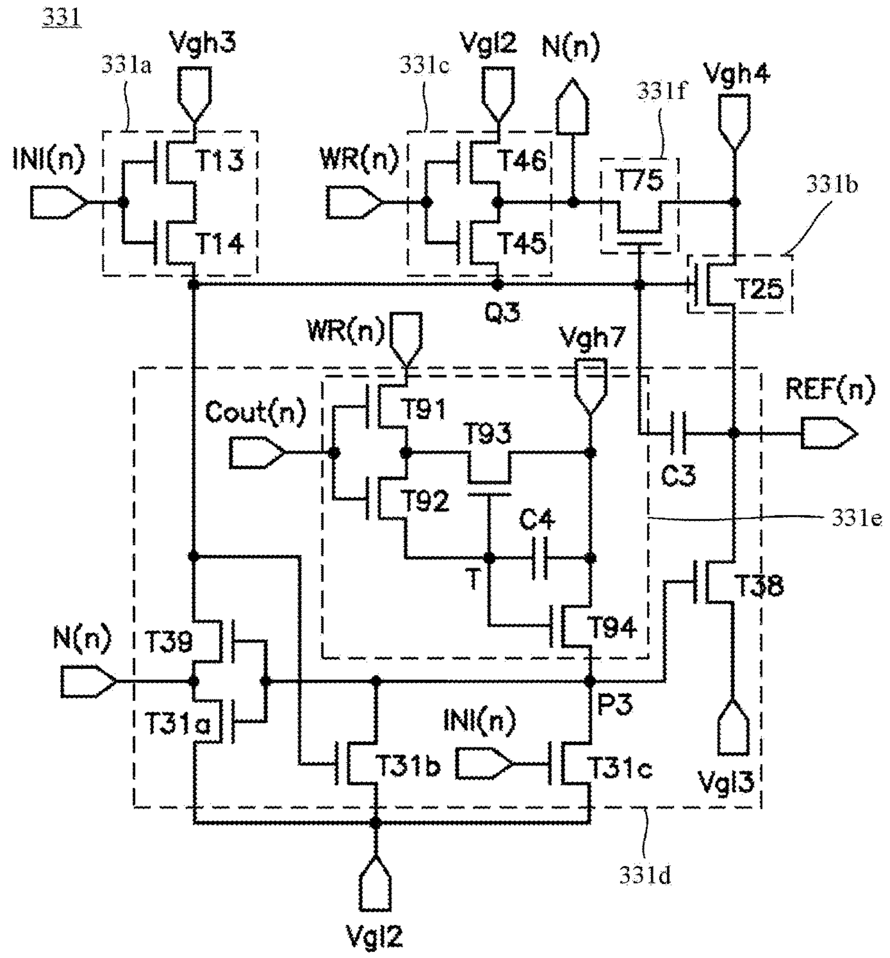
FIG. 16 is a circuit diagram of a third drive module according to one or more embodiments of the present disclosure.

For example, as to the third drive module 331 in FIGS. 3, 4, and 6 to 13, referring to FIG. 16, the third drive module 331 includes a third pull-up control unit 331*a*, a third pull-up unit 331*b*, a third pull-down unit 331*c*, and a third pull-down maintaining unit 331*d*.

In the structure in FIG. 16, the third pull-up control unit 331*a* includes a third pull-up control transistor T13 and a fourth pull-up control transistor T14. Both a gate of the third pull-up control transistor T13 and a gate of the fourth pull-up control transistor T14 are connected to the second signal output terminal INI(n), a first electrode of the third pull-up control transistor T13 is connected to a third high-potential line Vgh3, a second electrode of the third pull-up control transistor T13 is connected to the a electrode of the fourth pull-up control transistor T14, and a second electrode of the fourth pull-up control transistor T14 is connected to a fifth control node Q3.

In the structure in FIG. 16, the third pull-up unit 331*b* includes a fifth pull-up transistor T25 and a third storage capacitor C3. A first electrode of the fifth pull-up transistor T25 is connected to a fourth high-potential line Vgh4, a second electrode of the fifth pull-up transistor T25 is connected to the fourth signal output terminal REF(n), both a gate of the fourth pull-up transistor T24 and a first plate of the third storage capacitor C3 are connected to the fifth control node Q3, and a second plate of the third storage capacitor C3 is connected to the fourth signal output terminal REF(n).

In the structure in FIG. 16, the third pull-down unit 331*c* includes a fifth pull-down transistor T45 and a sixth pull-down transistor T46. Both a gate of the fifth pull-down transistor T45 and a gate of the sixth pull-down transistor T46 are connected to the first signal output terminal WR1 (*n*), a first electrode of the fifth pull-down transistor T45 is connected to the fifth control node Q3, a second electrode of the fifth pull-down transistor T45 is connected to a first electrode of the sixth pull-down transistor T46, and a second electrode of the sixth pull-down transistor T46 is connected to the second low-potential line Vgl2.

In the structure in FIG. 16, the third pull-down maintaining unit 331*d* includes an eighth pull-down maintaining transistor T38, a ninth pull-down maintaining transistor T39, a tenth pull-down maintaining transistor T31*a*, an eleventh pull-down maintaining transistor T31*b*, a twelfth pull-down maintaining transistor T31*c*, and a potential pull-up unit 331*e*. A gate of the eighth pull-down maintaining transistor T38, a gate of the ninth pull-down maintaining transistor T39, a gate of the tenth pull-down maintaining transistor T31*a*, and the potential pull-up unit 331*e* are all connected to a sixth control node P3, a first electrode of the eighth pull-down maintaining transistor T38 is connected to a second electrode of the fifth pull-up transistor T25, a second electrode of the eighth pull-down maintaining transistor T38 is connected to the third low-potential line Vgl3, a first electrode of the ninth pull-down maintaining transistor T39 is connected to the fifth control node Q3, a second electrode of the ninth pull-down maintaining transistor T39 is connected to a first electrode of the tenth pull-down maintaining transistor T31*a*, a second electrode of the tenth pull-down maintaining transistor T31*a* is connected to the second low-potential line Vgl2, a gate of the eleventh pull-down maintaining transistor T31*b* is connected to the fifth control node Q3, a first electrode of the eleventh pull-down maintenance transistor T31*b* is connected to the sixth control node P3, a second electrode of the eleventh pull-down maintenance transistor T31*b* is connected to the second low-potential line Vgl2, a gate of the twelfth pull-down maintenance transistor T31*c* is connected to the second signal output terminal INI(n), a first electrode of the twelfth pull-down maintenance transistor T31*c* is connected to the sixth control node P3, a second electrode of the eleventh pull-down maintenance transistor T31*b* is connected to the second low-potential line Vgl2. The potential pull-up unit 331*e* is used to invert potentials of the fifth control node Q3 and the sixth control node P3.

In one or more embodiments, the potential pull-up unit 331*e* includes a first pull-up transistor T91, a second pull-up transistor T92, a third pull-up transistor T93, a fourth pull-up transistor T94, and a fourth storage capacitor C4. Both a gate of the first pull-up transistor T91 and the gate of the second pull-up transistor T92 are connected to a cascade signal terminal Cout(n), a first electrode of the first pull-up transistor T91 is connected to the first signal output terminal WR1(*n*), a second electrode of the first pull-up transistor T91 is connected to a first electrode of the second pull-up transistor T92 and a first electrode of the third pull-up transistor T93, a second electrode of the second pull-up transistor T92 is connected to a gate of the third pull-up transistor T93, a first plate of the fourth storage capacitor C4, a gate of the fourth pull-up transistor T94, a second electrode of the third pull-up transistor T93, a second plate of the fourth storage capacitor C4 and a first electrode of the fourth pull-up transistor T94 are all connected to a seventh high-potential line Vgh7, and a second electrode of the fourth pull-up transistor T94 is connected to the sixth control node P3.

In the structure in FIG. 16, the third drive module 331 further includes a third leakage prevention unit 331*f* connected to the fifth control node Q3. The third leakage prevention unit 331*f* includes a fifth leakage prevention transistor T75. A first electrode of the fifth leakage prevention transistor T75 is connected to the fourth high-potential line Vgh4, a second electrode of the fifth leakage prevention transistor T75 is connected to the output terminal N(n) of the third leakage prevention unit 331*f*, and a gate of the fifth leakage prevention transistor T75 is connected to the fifth control node Q3.

In one or more embodiments, the second electrode of the ninth pull-down maintenance transistor T39, the first electrode of the tenth pull-down maintenance transistor T31*a*, the second electrode of the fifth pull-down transistor T45, and the first electrode of the sixth pull-down transistor T46 may all be connected to the output terminal N(n) of the third leakage prevention unit 331*f* to reduce the leakage current.

Note that the first signal output terminal WR1(*n*) and the cascade signal terminal Cout(n) in FIG. 16 are the first signal output terminal WR1(*n*) and the cascade signal terminal Cout(n) in FIG. 14, respectively. Both the first control signal and the cascade signal received in FIG. 16 are control signals of the present stage. The second signal output terminal INI(n) in FIG. 16 is the second signal output terminal INI(n) in FIG. 15, and the second control signal received in FIG. 16 is the control signal of the present stage.

Figure 17:
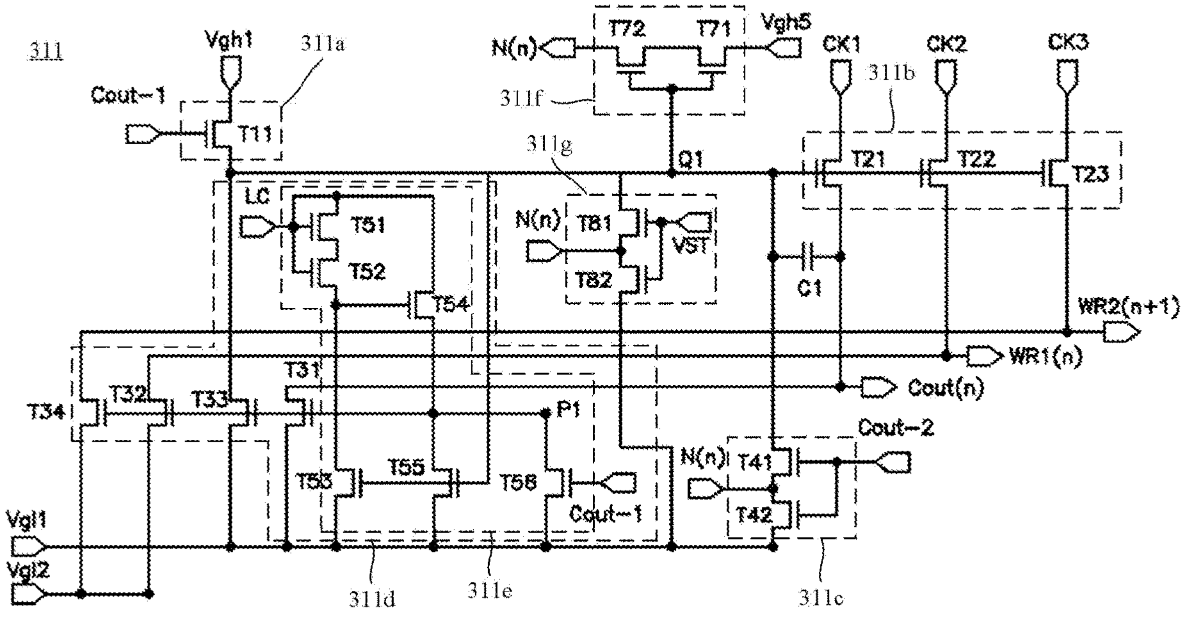
FIG. 17 is a circuit diagram of a second example of a first drive module according to one or more embodiments of the present disclosure.

For example, as to the first drive module 311 of FIGS. 10 to 13, refer to FIG. 17, which is the same as or similar to FIG. 14, with the difference as follows.

The first pull-up unit 311*b* further includes a third pull-up transistor T23. A first electrode of the third pull-up transistor T23 is connected to the third clock signal line CK3, a second electrode of the third pull-up transistor T23 is connected to the third signal output terminal WR2(*n*+1), and a gate of the third pull-up transistor T23 is connected to the first control node Q1.

The first pull-down maintaining unit 311*d* further includes a fourth pull-down maintaining transistor T34. A first electrode of the fourth pull-down maintaining transistor T34 is connected to the second electrode of the third pull-up transistor T23, a second electrode of the fourth pull-down maintaining transistor T34 is connected to the second low-potential line Vgl2, and a gate of the fourth pull-down maintaining transistor T34 is connected to the second control node P1.

In the structure in FIG. 14, one first drive module 311 outputs only one first control signal. In the structure in FIG. 17, one second drive module 321 may output two first control signals, and there is a phase difference between the two first control signals.

As can be seen from the configuration of FIGS. 7, 9, and 14 to 17, a timing diagram of a pulse signal outputted from the fourth signal output terminal REF(n) is adjusted by the first control signal outputted from the first signal output terminal WR1(*n*) and the second control signal outputted from the second signal output terminal INI(n).

Note that in the structures in FIGS. 14 to 17, the potential of the third low-potential line Vgl3 may be equal to the potential of the second low-potential line Vgl2, and the potential of the third low-potential line Vgl3 may be greater than the potential of the first low-potential line Vgl1. For example, the potential of the second low-potential line Vgl2 may be −8V, and the potential of the first low-potential line Vgl1 may be −10V, so that the potential of the first control node is pulled down to −8V. In the structure in FIG. 14, the potential of the first signal output terminal WR1(*n*) is pulled down to −10V, the first control node is the gate of the second pull-up transistor T22, and the first signal output terminal WR1(*n*) is a source terminal of the second pull-up transistor T22, so that potential difference between the gate and the source of the second pull-up transistor T22 is-2V, which is much less than a threshold voltage of the second pull-up transistor T22, and the second pull-up transistor T22 is turned off completely to prevent the second pull-up transistor T22 from being turned on and outputting a control signal when a row is not selected.

Note that in the structure of FIGS. 14 to 17, the voltages of the first low-potential line Vgl1, the second low-potential line Vgl2, and the third low-potential line Vgl3 may all be the same, that is, the first low-potential line Vgl1, the second low-potential line Vgl2, and the third low-potential line Vgl3 may be the same signal line to simplify the arrangement of the signal lines.

Note that in the configuration of FIGS. 14 to 17, according to one or more embodiments of the present disclosure, the potentials of the first high-potential line Vgh1, the second high-potential line Vgh2, the third high-potential line Vgh3, the fourth high-potential line Vgh14, the fifth high-potential line Vgh5, the sixth high-potential line Vgh6, and the seventh high-potential line Vgh7 may all be the same, that is, the first high-potential line Vgh1, the second high-potential line Vgh2, the third high-potential line Vgh3, the fourth high-potential line Vgh14, the fifth high-potential line Vgh5, the sixth high-potential line Vgh6, and the seventh high-potential line Vgh7 may be the same signal line to simplify the arrangement of the signal lines.

It should be noted that according to one or more embodiments of the present disclosure, the first electrode and the second electrode are one of the source and the drain that are different from each other, respectively.

Since the pull-up transistor is mainly used for outputting the control signal, the device performance of the pull-up transistor has a great influence on the stability of the output control signal. Since both the number of the second drive module 321 and the number of the third drive module 331 are reduced, devices arranged in a transverse direction in the second pull-up unit 321*b* and the third pull-up unit 331*b* may be arranged in a longitudinal direction.

In one or more embodiments, in the first direction X, the width of any one of the pull-up transistors in the first pull-up unit 311*b* is greater than the width of any one of the pull-up transistors in the second pull-up unit 321*b*, and in the second direction Y, the length of any one of the pull-up transistors in the first pull-up unit 311*b* is less than the length of any one of the pull-up transistors in the second pull-up unit 321*b*.

As to the structures in FIGS. 6 and 8, the number of the first drive modules 311 is less than the number of the second drive modules 321, that is, the longitudinal length of two or four first drive modules 311 is equal to the longitudinal length of one second drive module 321. Also, the pull-up transistor in the first pull-up unit 311*b* is the second pull-up transistor T22, the pull-up transistor in the second pull-up unit 321*b* is the fourth pull-up transistor T24. A part of the devices arranged transversely in the fourth pull-up transistor T24 in the second pull-up unit 321*b* may be arranged longitudinally, that is, the transverse width of the fourth pull-up transistor T24 is reduced, and the longitudinal length of the fourth pull-up transistor T24 is increased. Therefore, the transverse width of the second pull-up transistor T22 is greater than the transverse width of the fourth pull-up transistor T24, and the longitudinal length of the second pull-up transistor T22 is less than the longitudinal length of the fourth pull-up transistor T24.

As to the structure of FIG. 10, the number of the first drive modules 311 is equal to the number of the second drive modules 321, that is, the longitudinal length of one first drive module 311 is equal to the longitudinal length of one second drive module 321, but the first drive module 311 needs to be provided with both the second pull-up transistor T22 and the third pull-up transistor T23 at the same longitudinal length. According to one or more embodiments of the present disclosure, the second pull-up transistor T22 and the third pull-up transistor T23 are generally arranged longitudinally. Therefore, both the transverse width of the second pull-up transistor T22 and the transverse width of the third pull-up transistor T23 are greater than the transverse width of the fourth pull-up transistor T24, and both the longitudinal length of the second pull-up transistor T22 and the longitudinal length of the third pull-up transistor T23 are less than the longitudinal length of the fourth pull-up transistor T24.

As to the structure in FIG. 11, based on FIG. 10, the transverse width of the fourth pull-up transistor T24 may be further reduced, and the longitudinal length of the fourth pull-up transistor T24 may be further increased, so that the transverse width of the second pull-up transistor T22 is greater than the transverse width of the fourth pull-up transistor T24, and the longitudinal length of the second pull-up transistor T22 is less than the longitudinal length of the fourth pull-up transistor T24.

Similarly, as to the third pull-up unit 331*b*, the transverse width of the second pull-up transistor T22 is greater than the transverse width of the fifth pull-up transistor T25, and the longitudinal length of the second pull-up transistor T22 is less than the longitudinal length of the fifth pull-up transistor T25.

Taking the structure of the second pull-up transistor T22 in FIG. 12 and the structure the fourth pull-up transistor T24 in FIG. 13 as examples, explanation is made in the following.

Figure 18:
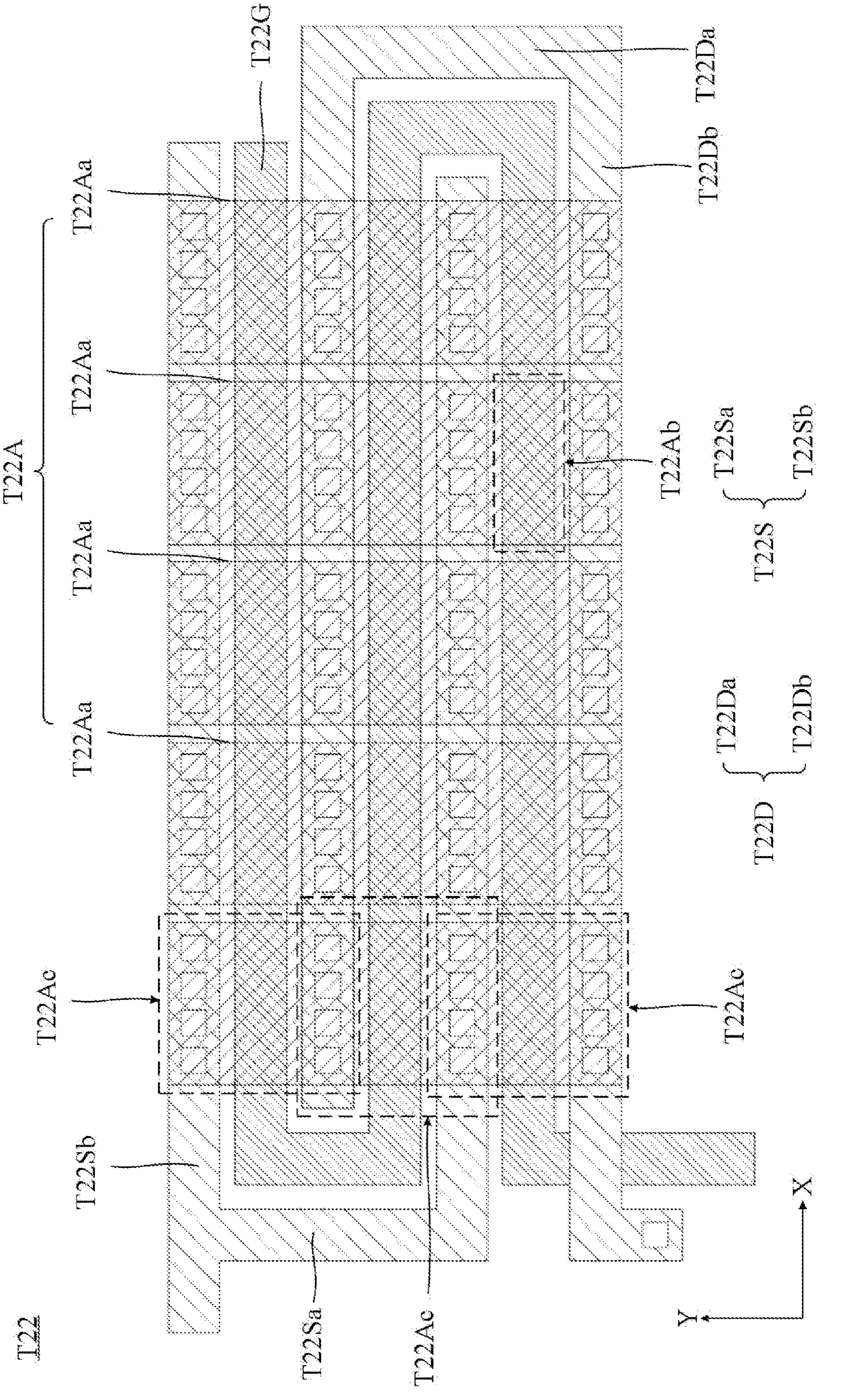
FIG. 18 schematically illustrates a structure of a second pull-up transistor in a first drive module according to one or more embodiments of the present disclosure.

Referring to FIG. 18, the second pull-up transistor T22 includes a first gate T22G, a first source T22S, a first drain T22D, and a first active part T22A. The first gate T22G is disposed between the first source T22S and the first drain T22D, a first source T22S, a first drain T22D, and a first active part T22A. The first active part T22A overlaps each of the first gate T22G, the first source T22S, and the first drain T22D, and an overlapping part between the first active part T22A and the first gate T22G is a channel of the first active part T22A.

Referring to FIG. 18, the first source T22S includes a first trunk source T22Sa and multiple first branch sources T22Sb connected to the first trunk source T22Sa. The first drain T22D includes a first trunk drain T22Da and multiple first branch drains T22Db connected to the first trunk drain T22Da. The first trunk source T22Sa and the first trunk drain T22Da both extend in a second direction Y, each of the first branch sources T22Sb and each of the first branch drains T22Db extend in a first direction X, and the multiple first branch sources T22Sb and the multiple first branch drains T22Db are alternately arranged at intervals in the second direction Y. The first active part T22A includes multiple first active sub-parts T22Aa arranged in the first direction X, and each of the first active sub-parts T22Aa overlaps the first gate electrode T22G, the first branch source T22Sb and the first branch drain T22Db.

Referring to FIG. 18, the first source T22S includes a first trunk source T22Sa and two first branch sources T22Sb, and the first drain T22D includes a first trunk drain T22Da and two first branch drains T22Db. The first gate electrode T22G is S-shaped, and is disposed between the two first branch sources T22Sb disposed at intervals and the two first branch drains T22Db disposed at intervals. Also, the first active part T22A includes five first active sub-parts T22Aa, each of the first active sub-parts T22Aa overlaps the two first branch sources T22Sb, the two first branch drains T22Db, and the first gate T22G located between the first branch sources T22Sb and the first branch drains T22Db. One first active sub-part T22Aa and the first gate T22G have three overlapping segments, and each of the overlapping segments is a first channel sub-part T22Ab, that is, each of the first active sub-parts T22Aa has three first channel sub-parts T22Ab. One first channel sub-part T22Ab and the branch source and the branch drain respectively on both sides of the first channel sub-part T22Ab may constitute one first transistor unit T22AC. The second pull-up transistor T22 in FIG. 18 may include 15 first transistor units T22AC.

Figure 19:
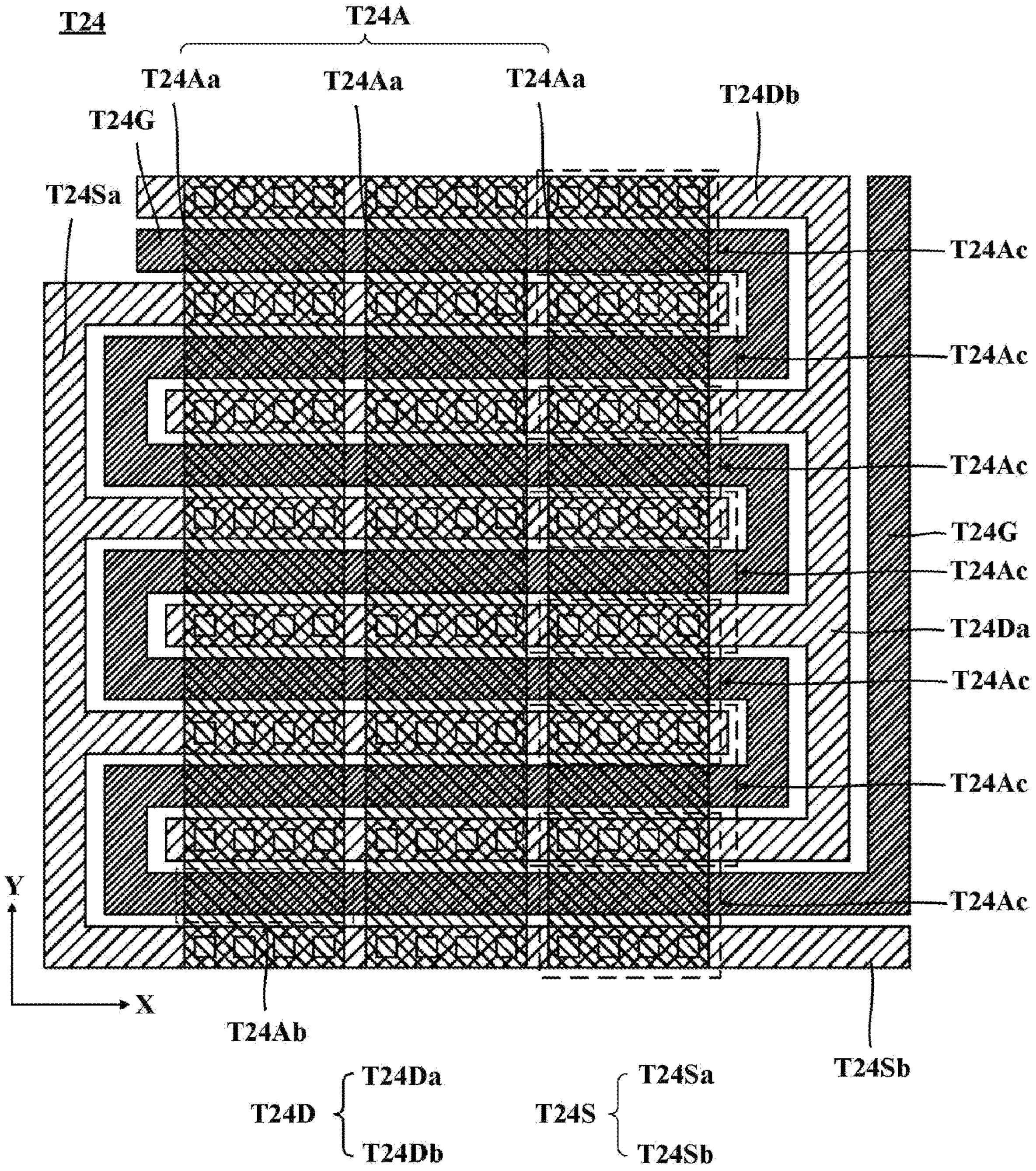
FIG. 19 schematically illustrates a structure of a fourth pull-up transistor in a second drive module according to one or more embodiments of the present disclosure.

Referring to FIG. 19, the fourth pull-up transistor T24 includes a second gate T24G, a second source T24S, a second drain T24D, and a second active part T24A. The second gate electrode T24G is disposed between the second source T24S and the second drain T24D, and the second active part T24A overlaps the second gate electrode T24G, the second source T24S, and the second drain T24D. An overlapping part between the second gate electrode T24G and the second active part T24A is a channel of the second active part T24A.

Referring to FIG. 19, the second source T24S includes a second trunk source T24Sa and multiple second branch sources T24Sb connected to the second trunk source T24Sa, and the second drain T24D includes a second trunk drain T24 Da and multiple second branch drains T24Db connected to the second trunk drain T24 Da. Both the second trunk source T24Sa and the second trunk drain T24 Da extend in a second direction Y, each of the second branch sources T24Sb and each of the second branch sources T24Sb extend in the first direction X, and the multiple second branch sources T24Sb and the multiple second branch drains T24Db are alternately arranged at intervals in the second direction Y. The second active part T24A includes multiple second active sub-parts T24Aa arranged in the first direction X, and each of the second active sub-parts T24Aa overlaps the second gate electrode T24G, the second branch source T24Sb and the second branch drain T24Db.

Referring to FIG. 19, the second source T24S includes one second trunk source T24Sa and four second branch sources T24Sb, and the second drain T24D includes one second trunk drain T24 Da and four second branch drains T24Db. The second gate T24G is S-shaped, and the second gate T24G is located between the four second branch sources T24Sb provided at intervals and the four second branch drains T24Db provided at intervals. Also, the second active part T24A includes three second active sub-parts T24Aa, and each of the second active sub-parts T24Aa overlaps four second branch sources T24Sb, four second branch drains T24Db, and the second gate T24G located between the second branch sources T24Sb and the second branch drains T24Db. One second active sub-part T24Aa and the second gate T24G have seven overlapping segments, and each of the overlapping segments is a second channel sub-parts T24Ab, that is, each of the second active sub-parts T24Aa has seven second channel sub-parts T24Ab. One second channel sub-part T24Ab and the branch source and the branch drain respectively on both sides of the second channel sub-part T24Ab may constitute one second transistor unit T24AC. The fourth pull-up transistor T24 in FIG. 19 may include 21 second transistor units T24AC.

Note that in the first direction X, the width of the first active sub-part T22Aa is equal to the width of the second active sub-part T24Aa. In the second direction Y, the length of the first active sub-part T22Aa is less than the length of the second active sub-part T24Aa. The number of the first active sub-parts T22Aa is greater than the number of the second active sub-parts T24Aa.

In the structure of FIG. 18, the second pull-up transistor T22 includes 3×5 first transistor units T22AC provided in an array. In the structure of FIG. 19, the fourth pull-up transistor T24 includes 7×3 second transistor units T24AC provided in an array. That is, the channel of the first active part T22A may include 15 first channel sub-parts T22Ab, and the channel of the second active part T24A may include 21 second channel sub-parts T24Ab. The length and width of the first transistor unit T22AC in FIG. 18 are equal to the length and width of the second transistor unit T24AC in FIG. 19, respectively, that is, the length and width of the first channel sub-parts T22Ab are equal to the length and width of the second channel sub-parts T24Ab, respectively. Thus, according to one or more embodiments of the present disclosure, the channel length of the first active part T22A is less than the channel length of the second active part T24A.

It should be noted that a structure of a related fourth pull-up transistor T24 may be referred to the structure of the second pull-up transistor T22 in FIG. 18, that is, a related second transistor unit T24AC arranged in a 3×5 array is changed into the second transistor unit T24AC arranged in a 7×3 array according to one or more embodiments of the present disclosure. That is, according to one or more embodiments of the present disclosure, a part of the second transistor unit T24AC arranged transversely are arranged longitudinally, thereby reducing the width of the fourth pull-up transistor T24 in a horizontal direction. In addition, according to one or more embodiments of the present disclosure, the 15 second transistor units T24AC are changed to 21 second transistor units T24AC. Thus, sizes of the second gate T24G, the second source T24S, the second drain T24D, and the second active part T24A in the fourth pull-up transistor T24 are increased, and the load of the fourth pull-up transistor T24 is increased, thereby ensuring the stability of the control signal output from the fourth pull-up transistor T24.

According to one or more embodiments of the present disclosure, a display device includes a terminal body and the display panel 100, wherein the terminal body and the display panel 100 are coupled. The terminal body may include a device such as a circuit board or the like bonded to the display panel 100, a cover plate or the like covering on the display panel 100. The display device may include an electronic device such as a mobile phone, a television, or a notebook computer.

Some embodiments of the present disclosure have been described in detail above. The description of the above embodiments merely aims to help to understand the present disclosure. Many modifications or equivalent substitutions with respect to the embodiments may occur to those of ordinary skill in the art based on the present disclosure. Thus, these modifications or equivalent substitutions shall fall within the scope of the present disclosure.

What is claimed is:

1. A display panel, comprising:

a display part comprising a plurality of sub-pixel rows, wherein each of the sub-pixel rows comprises a plurality of sub-pixel units each provided with a pixel circuit; and a drive part, wherein the drive part and the display part are arranged in a first direction, the drive part comprises a first drive circuit and a second drive circuit that are arranged in the first direction, the second drive circuit is disposed between the first drive circuit and the display part, the first drive circuit comprises a plurality of first drive modules arranged in a second direction, and the second drive circuit comprises a plurality of second drive modules arranged in the second direction, wherein each of the first drive modules is electrically connected to the pixel circuit in each of the sub-pixel units of each of k ones of the sub-pixel rows adjacent to the each of the first drive modules, and each of the second drive modules is electrically connected to the pixel circuit in each of the sub-pixel units of each of j ones of the sub-pixel rows adjacent to the each of the second drive modules, where each of k and j is a positive integer, k is less than or equal to j, and j is greater than or equal to 2, wherein the pixel circuit comprises a switch transistor, a drive transistor, and a first reset transistor, the switch transistor and the drive transistor are connected to a first reset node, and the first reset transistor and the drive transistor are connected to a second reset node, wherein the first drive modules are cascaded, and each of the first drive modules has a first signal output terminal, wherein the second drive modules are cascaded, and each of the second drive modules has a second signal output terminal, and wherein, in a case that k is equal to 1 and j is equal to 2, the first signal output terminal of a n-th stage one of the first drive modules is connected to a gate of the switch transistor of the pixel circuit in each of the sub-pixel units of a n-th one of the sub-pixel rows, the first signal output terminal of a (n+1)-th stage one of the first drive modules is connected to the gate of the switch transistor of the pixel circuit in each of the sub-pixel units of a (n+1)-th one of the sub-pixel rows, and the second signal output terminal of an a-th stage one of the second drive modules is connected to a gate of the first reset transistor of the pixel circuit in each of the sub-pixel units of each of the n-th one and the (n+1)-th one of the sub-pixel rows, where n is a positive integer, and a is a positive integer equal to (n+1)/2; or in a case that k is equal to 1 and j is equal to 4, the first signal output terminal of a n-th stage one of the first drive modules is connected to a gate of the switch transistor of the pixel circuit in each of the sub-pixel units of a n-th one of the sub-pixel rows, the first signal output terminal of a (n+1)-th stage one of the first drive modules is connected to the gate of the switch transistor of the pixel circuit in each of the sub-pixel units of a (n+1)-th one of the sub-pixel rows, the first signal output terminal of a (n+2)-th stage one of the first drive modules is connected to the gate of the switch transistor of the pixel circuit in each of the sub-pixel units of a (n+2)-th one of the sub-pixel rows, the first signal output terminal of a (n+3)-th stage one of the first drive modules is connected to the gate of the switch transistor of the pixel circuit in each of the sub-pixel units of a (n+3)-th one of the sub-pixel rows, and the second signal output terminal of an a-th stage one of the second drive modules is connected to a gate of the first reset transistor of the pixel circuit in each of the sub-pixel units of each of the n-th one to the (n+3)-th one of the sub-pixel rows, where n is a positive integer, and a is a positive integer equal to (n+3)/4; or wherein the each of the first drive modules has a third signal output terminal, and in a case that k is equal to 2 and j is equal to 2, the first signal output terminal of a b-th stage one of the first drive modules is connected to a gate of the switch transistor of the pixel circuit in each of the sub-pixel units of a n-th one of the sub-pixel rows, the third signal output terminal of the b-th stage one of the first drive modules is connected to the gate of the switch transistor of the pixel circuit in each of the sub-pixel units of a (n+1)-th one of the sub-pixel rows, and the second signal output terminal of an a-th stage one of the second drive modules is connected to a gate of the first reset transistor of the pixel circuit in each of the sub-pixel units of each of the n-th one and the (n+1)-th one of the sub-pixel rows, where n is a positive integer, and each of a and b is a positive integer equal to (n+1)/2; or wherein the each of the first drive modules has a third signal output terminal, and in a case that k is equal to 2 and j is equal to 4, the first signal output terminal of a b-th stage one of the first drive modules is connected to a gate of the switch transistor of the pixel circuit in each of the sub-pixel units of a n-th one of the sub-pixel rows, the third signal output terminal of the b-th stage one of the first drive modules is connected to the gate of the switch transistor of the pixel circuit in each of the sub-pixel units of a (n+1)-th one of the sub-pixel rows, the first signal output terminal of a (b+1)-th stage one of the first drive modules is connected to the gate of the switch transistor of the pixel circuit in each of the sub-pixel units of a (n+2)-th one of the sub-pixel rows, the third signal output terminal of the (b+1)-th stage one of the first drive modules is connected to the gate of the switch transistor of the pixel circuit in each of the sub-pixel units of a (n+3)-th one of the sub-pixel rows, and the second signal output terminal of an a-th stage one of the second drive modules is connected to a gate of the first reset transistor of the pixel circuit in each of the sub-pixel units of each of the n-th one to the (n+3)-th one of the sub-pixel rows, where n is a positive integer, b is a positive integer equal to (n+1)/2, and a is a positive integer equal to (n+3)/4.

2. The display panel according to claim 1, wherein, in a case that the each of the first drive modules has the first signal output terminal, a number of the first drive modules is greater than a number of the second drive modules; and each of the first drive modules has a greater width than each of the second drive modules in the first direction, and has a less length than each of the second drive modules in the second direction.

3. The display panel according to claim 1, wherein, in a case that the each of the first drive modules has the first signal output terminal and the third signal output terminal, a number of the first drive modules is equal to a number of the second drive modules; and each of the first drive modules has a greater width than each of the second drive modules in the first direction, and has a length less than or equal to a length of each of the second drive modules in the second direction.

4. The display panel according to claim 3, wherein each of the first drive modules comprises a first pull-up control circuit, a first pull-up circuit, a first pull-down circuit, and a first pull-down maintenance circuit;

each of the second drive modules comprises a second pull-up control circuit, a second pull-up circuit, a second pull-down circuit, and a second pull-down maintenance circuit; and each of one or more pull-up transistors in the first pull-up circuit has a greater width than each of one or more pull-up transistors in the second pull-up circuit in the first direction, and has a less length than each of the one or more pull-up transistors in the second pull-up circuit in the second direction.

5. The display panel according to claim 4, wherein the first pull-up control circuit comprises a first pull-up control transistor having a gate connected to a first cascade signal line, a first electrode connected to a first high-potential line, and a second electrode connected to a first control node;

the one or more pull-up transistors in the first pull-up circuit comprise a first pull-up transistor and a second pull-up transistor, and the first pull-up circuit further comprises a first storage capacitor, wherein the first pull-up transistor has a gate connected to the first control node, a first electrode connected to a first clock signal line, and a second electrode connected to a cascade signal terminal; the second pull-up transistor has a gate connected to the first control node, a first electrode connected to a second clock signal line, and a second electrode connected to the first signal output terminal of the each of the first drive modules; and the first storage capacitor has a first plate connected to the first control node, and a second plate connected to the cascade signal terminal;

the first pull-down circuit comprises a first pull-down transistor and a second pull-down transistor, wherein each of a gate of the first pull-down transistor and a gate of the second pull-down transistor is connected to a second cascade signal line, a first electrode of the first pull-down transistor is connected to the first control node, a second electrode of the first pull-down transistor is connected to a first electrode of the second pull-down transistor, and a second electrode of the second pull-down transistor is connected to a first low-potential line;

the first pull-down maintenance circuit comprises a first pull-down maintenance transistor, a second pull-down maintenance transistor, a third pull-down maintenance transistor, and a first inverter connected to a second control node, wherein the first pull-down maintenance transistor has a gate connected to the second control node, a first electrode connected to the second electrode of the first pull-up transistor, and a second electrode connected to the first low-potential line; the second pull-down maintenance transistor has a gate connected to the second control node, a first electrode connected to the second electrode of the second pull-up transistor, and a second electrode connected to a second low-potential line; and the third pull-down maintenance transistor has a gate connected to the second control node, a first electrode connected to the first control node, and a second electrode connected to the first low-potential line; and the first inverter is configured to enable a potential at the first control node to be opposite to a potential at the second control node.

6. The display panel according to claim 5, wherein the one or more pull-up transistors in the first pull-up circuit further comprise a third pull-up transistor having a first electrode connected to a third clock signal line, a second electrode connected to the third signal output terminal of the each of the first drive modules, and a gate connected to the first control node; and the first pull-down maintenance circuit further comprises a fourth pull-down maintenance transistor having a first electrode connected to the second electrode of the third pull-up transistor, a second electrode connected to the second low-potential line, and a gate connected to the second control node.

7. The display panel according to claim 5, wherein the second pull-up control circuit comprises a second pull-up control transistor having a gate connected to a first signal transmission line, a first electrode connected to a second high-potential line, and a second electrode connected to a third control node;

the one or more pull-up transistors in the second pull-up circuit comprise a fourth pull-up transistor, and the second pull-up circuit further comprises a second storage capacitor, wherein the fourth pull-up transistor has a gate connected to the third control node, a first electrode connected to a fourth clock signal line, and a second electrode connected to the second signal output terminal of the each of the second drive modules; and the second storage capacitor has a first plate connected to the third control node, and a second plate connected to the second signal output terminal of the each of the second drive modules;

the second pull-down circuit comprises a third pull-down transistor and a fourth pull-down transistor, wherein each of a gate of the third pull-down transistor and a gate of the fourth pull-down transistor is connected to a second signal transmission line, a first electrode of the third pull-down transistor is connected to the third control node, a second electrode of the third pull-down transistor is connected to a first electrode of the fourth pull-down transistor, and a second electrode of the fourth pull-down transistor is connected to the first low-potential line;

the second pull-down maintenance circuit comprises a fifth pull-down maintenance transistor, a sixth pull-down maintenance transistor, a seventh pull-down maintenance transistor, and a second inverter connected to a fourth control node, wherein the fifth pull-down maintenance transistor has a gate connected to the fourth control node, a first electrode connected to the second electrode of the fourth pull-up transistor, and a second electrode connected to the first low-potential line; the sixth pull-down maintenance transistor has a gate connected to the fourth control node, a first electrode connected to the third control node, and a second electrode connected to a first electrode of the seventh pull-down maintenance transistor; and the seventh pull-down maintenance transistor further has a gate connected to the fourth control node and a second electrode connected to the first low-potential line; and the second inverter is configured to enable a potential at the third control node to be opposite to a potential at the fourth control node.

8. The display panel according to claim 7, wherein the second pull-up transistor comprises a first gate, a first source, a first drain, and a first active part, the first gate being disposed between the first source and the first drain, the first active part overlapping each of the first gate, the first source and the first drain;

the fourth pull-up transistor comprises a second gate, a second source, a second drain, and a second active part, the second gate being disposed between the second source and the second drain, the second active part overlapping each of the second gate, the second source and the second drain; and a length of a channel of the first active part is less than a length of a channel of the second active part.

9. The display panel according to claim 8, wherein the first source comprises a first trunk source and a plurality of first branch sources connected to the first trunk source; the first drain comprises a first trunk drain and a plurality of first branch drains connected to the first trunk drain; each of the first trunk source and the first trunk drain extends in the second direction; each of the first branch sources and the first branch drains extends in the first direction; and the plurality of first branch sources and the plurality of first branch drains are alternately arranged at intervals in the second direction;

the second source comprises a second trunk source and a plurality of second branch sources connected to the second trunk source; the second drain comprises a second trunk drain and a plurality of second branch drains connected to the second trunk drain; each of the second trunk source and the second trunk drain extends in the second direction; each of the second branch sources and the second branch drains extends in the first direction; and the plurality of second branch sources and the plurality of second branch drains are alternately arranged at intervals in the second direction; and the first active part comprises a plurality of first active sub-parts arranged in the first direction, each of the first active sub-parts overlapping the first gate, the first branch sources and the first branch drains; and the second active part comprises a plurality of second active sub-parts arranged in the first direction, each of the second active sub-parts overlapping the second gate, the second branch sources and the second branch drains.

10. The display panel according to claim 9, wherein a width of each of the first active sub-parts is equal to a width of each of the second active sub-parts in the first direction, a length of each of the first active sub-parts is less than a length of each of the second active sub-parts in the second direction, and a number of the first active sub-parts is greater than a number of the second active sub-parts.

11. The display panel according to claim 7, wherein the drive part further comprises a third drive circuit, and the first drive circuit, the second drive circuit and the third drive circuit are arranged in the first direction;

the third drive circuit comprises a plurality of third drive modules arranged in the second direction, the third drive modules are cascaded, and each of the third drive modules comprises a fourth signal output terminal;

the pixel circuit further comprises a second reset transistor connected to the first reset node; and the fourth signal output terminal of an a-th stage one of the third drive modules is connected to a gate of the second reset transistor of the pixel circuit in each of the sub-pixel units of each of the n-th one and the (n+1)-th one of the sub-pixel rows.

12. The display panel according to claim 11, wherein each of the third drive modules comprises:

a third pull-up control unit comprising a third pull-up control transistor and a fourth pull-up control transistor, wherein each of the third pull-up control transistor and the fourth pull-up control transistor has a gate connected to the second signal output terminal of one of the second drive modules; the third pull-up control transistor further has a first electrode connected to a third high-potential line, and a second electrode connected to a first electrode of the fourth pull-up control transistor; and a second electrode of the fourth pull-up control transistor is connected to a fifth control node;

a third pull-up unit comprising a fifth pull-up transistor and a third storage capacitor, wherein the fifth pull-up transistor has a gate connected to the fifth control node, a first electrode connected to a fourth high-potential line, and a second electrode connected to the fourth signal output terminal of the each of the third drive modules; and the third storage capacitor has a first plate connected to the fifth control node, and a second plate connected to the fourth signal output terminal of the each of the third drive modules;

a third pull-down unit comprising a fifth pull-down transistor and a sixth pull-down transistor, wherein each of the fifth pull-down transistor and the sixth pull-down transistor has a gate connected to the first signal output terminal of one of the first drive modules; the fifth pull-down transistor further has a first electrode connected to the fifth control node, and a second electrode connected to a first electrode of the sixth pull-down transistor; and a second electrode of the sixth pull-down transistor is connected to the second low-potential line;

a third pull-down maintenance unit comprising an eighth pull-down maintenance transistor, a ninth pull-down maintenance transistor, a tenth pull-down maintenance transistor, an eleventh pull-down maintenance transistor, a twelfth pull-down maintenance transistor, and a potential pull-up circuit connected to a sixth control node, wherein each of the eighth pull-down maintenance transistor, the ninth pull-down maintenance transistor and the tenth pull-down maintenance transistor has a gate connected to the sixth control node; the eighth pull-down maintenance transistor further has a first electrode connected to the second electrode of the fifth pull-up transistor, and a second electrode connected to a third low-potential line; the ninth pull-down maintenance transistor further has a first electrode connected to the fifth control node, and a second electrode connected to a first electrode of the tenth pull-down maintenance transistor; a second electrode of the tenth pull-down maintenance transistor is connected to the second low-potential line; the eleventh pull-down maintenance transistor has a gate connected to the fifth control node, a first electrode connected to the sixth control node, and a second electrode connected to the second low-potential line; and the twelfth pull-down maintenance transistor has a gate connected to the second signal output terminal of the one of the second drive modules, a first electrode connected to the sixth control node, and a second electrode connected to the second low-potential line; and the potential pull-up circuit is configured to enable a potential at the fifth control node to be opposite to a potential at the sixth control node.

* * * * *